US011720723B2

(12) United States Patent
Kosmala et al.

(10) Patent No.: US 11,720,723 B2
(45) Date of Patent: Aug. 8, 2023

(54) METHOD AND APPARATUS FOR GENERATION AND EMPLOYMENT OF PARCEL SUSTAINABILITY ATTRIBUTES FOR LAND PARCEL VALUATION

(71) Applicant: CIBO TECHNOLOGIES, INC., Cambridge, MA (US)

(72) Inventors: Margaret C. Kosmala, Acton, MA (US); Pankaj C. Bhambhani, Malden, MA (US); Ernesto Brau, Newton, MA (US); R. Shane Bussmann, Cambridge, MA (US); Marie A. Coffin, Cary, NC (US); Amy E. Hawkins, Saint Louis, MO (US); Jason M. Rute, Somerville, MA (US); Samuel P. White, Minneapolis, MN (US)

(73) Assignee: CIBO Technologies, Inc., St. Louis Park, MN (US)

( * ) Notice: Subject to any disclaimer, the term of this patent is extended or adjusted under 35 U.S.C. 154(b) by 776 days.

(21) Appl. No.: 16/791,954

(22) Filed: Feb. 14, 2020

(65) Prior Publication Data
US 2021/0257111 A1   Aug. 19, 2021

(51) Int. Cl.
*G16Y 10/05* (2020.01)
*G16Y 20/10* (2020.01)
(Continued)

(52) U.S. Cl.
CPC ....... *G06F 30/20* (2020.01); *G06Q 10/06393* (2013.01); *G06T 7/97* (2017.01);
(Continued)

(58) Field of Classification Search
CPC ... G06F 30/20; G06F 16/29; G06Q 10/06393; G06Q 50/02; G06Q 10/063;
(Continued)

(56) References Cited

U.S. PATENT DOCUMENTS 7,184,892 B1 * 2/2007 Dyer .................. G06Q 10/00
702/5
7,415,356 B1   8/2008 Gowda et al.
(Continued)

OTHER PUBLICATIONS

Murray, William G. et al. "Yield Tests and Land Valuation" vol. 23, No. 252, Article 1. Agricultural Experiment Station, Iowa State College of Agriculture and Mechanic Arts, Mar. 1939. pp. 53-76.
(Continued)

*Primary Examiner* — Jeffrey P Aiello
(74) *Attorney, Agent, or Firm* — Richard K. Huffman; Huffman Patent Group, LLC

(57) ABSTRACT

A method for agricultural land parcel valuation includes: accessing data for parcels within a prescribed region, the data comprising management practices, historical weather conditions, locations and topography, remote sense images, soil types, and crop types; assessing and ranking the management practices for each of the parcels; generating simulation inputs for the each of the parcels, where the simulation inputs comprise highest ranked management practices, the historical weather conditions, the locations and topography, the soil types, and the crop types; simulating crop growth for the each of the parcels over a prescribed number of previous years, where the simulating employs the simulation inputs provided by the generating; and employing selected outputs from the simulating to calculate agricultural metrics and a valuation corresponding to the each of the parcels, where the agricultural metrics include a sustainability metric.

20 Claims, 18 Drawing Sheets

(51) Int. Cl.
    *G06Q 10/06* (2023.01)
    *G06T 7/00* (2017.01)
    *G06F 30/20* (2020.01)
    *G06Q 10/0639* (2023.01)

(52) U.S. Cl.
    CPC .............. *G16Y 10/05* (2020.01); *G16Y 20/10* (2020.01); *G06T 2207/20212* (2013.01); *G06T 2207/30188* (2013.01)

(58) Field of Classification Search
    CPC ........... G06Q 10/0639; G06Q 30/0278; G06Q 50/16; G06Q 30/06; G06T 2207/20212; G06T 2207/30188; G06T 7/97; G16Y 10/05; G16Y 20/10; G01N 33/0098
    USPC ................... 382/110; 702/2–5, 182; 705/313
    See application file for complete search history.

(56) References Cited

U.S. PATENT DOCUMENTS

| | | | |
|---|---|---|---|
| 9,213,461 | B2 | 12/2015 | Eraker et al. |
| 9,411,901 | B2 | 8/2016 | Bacus et al. |
| 9,706,011 | B2 | 7/2017 | Smedberg et al. |
| 10,074,111 | B2 | 9/2018 | Humphries et al. |
| 10,188,049 | B1 | 1/2019 | Emanuel |
| 10,477,756 | B1 | 11/2019 | Richt et al. |
| 10,521,191 | B1 | 12/2019 | Puttick |
| 2005/0203671 | A1 | 9/2005 | Mertins et al. |
| 2006/0282228 | A1* | 12/2006 | Avey ...................... G06Q 40/06 702/81 |
| 2011/0010213 | A1 | 1/2011 | Peterson et al. |
| 2013/0173321 | A1 | 7/2013 | Johnson |
| 2015/0074002 | A1* | 3/2015 | Johnson ................. G06Q 50/16 705/306 |
| 2015/0379588 | A1 | 12/2015 | Ma et al. |
| 2016/0203146 | A1 | 7/2016 | Moll et al. |
| 2016/0232621 | A1* | 8/2016 | Ethington .............. G06Q 50/02 |
| 2016/0309646 | A1 | 10/2016 | Starr et al. |
| 2018/0018517 | A1 | 1/2018 | Zhong et al. |
| 2018/0075546 | A1 | 3/2018 | Richt |
| 2018/0132423 | A1 | 5/2018 | Rowan et al. |
| 2018/0181893 | A1* | 6/2018 | Basso .................... G06Q 10/06 |
| 2018/0189564 | A1 | 7/2018 | Freitag et al. |
| 2018/0293671 | A1 | 10/2018 | Murr et al. |
| 2019/0057461 | A1 | 2/2019 | Ruff et al. |
| 2019/0090432 | A1* | 3/2019 | Duquette ............... G06Q 10/04 |
| 2019/0335674 | A1 | 11/2019 | Basso |
| 2019/0347745 | A1 | 11/2019 | Bones et al. |
| 2020/0005401 | A1* | 1/2020 | Bull ................ G06Q 10/06315 |
| 2020/0042890 | A1 | 2/2020 | Merrill et al. |
| 2020/0134485 | A1* | 4/2020 | Sood ....................... G06N 20/00 |
| 2020/0178483 | A1* | 6/2020 | Devecigil ............... G06F 16/51 |
| 2020/0273172 | A1 | 8/2020 | Weldermariam et al. |
| 2021/0209705 | A1 | 7/2021 | Englard et al. |

OTHER PUBLICATIONS

Puntel, Laila A. et al. "Modeling Long-Term Corn Yield Response to Nitrogen Rate and Crop Rotation." Frontiers in Plant Science vol. 7. Published Nov. 11, 2016. pp. 1-18.

Cox, M.S. et al. "Soil Management Zone Determination by Yield Stability Analysis and Classification." *Agronomy Journal*, Sep./Oct. 2007; 99,5, ProQuest Central. pp. 1357-1365. Retrieved from https://www.proquest.com/scholarly-journals/soil-management-zone-determination-yield/docview/194533938/se-2).

* cited by examiner

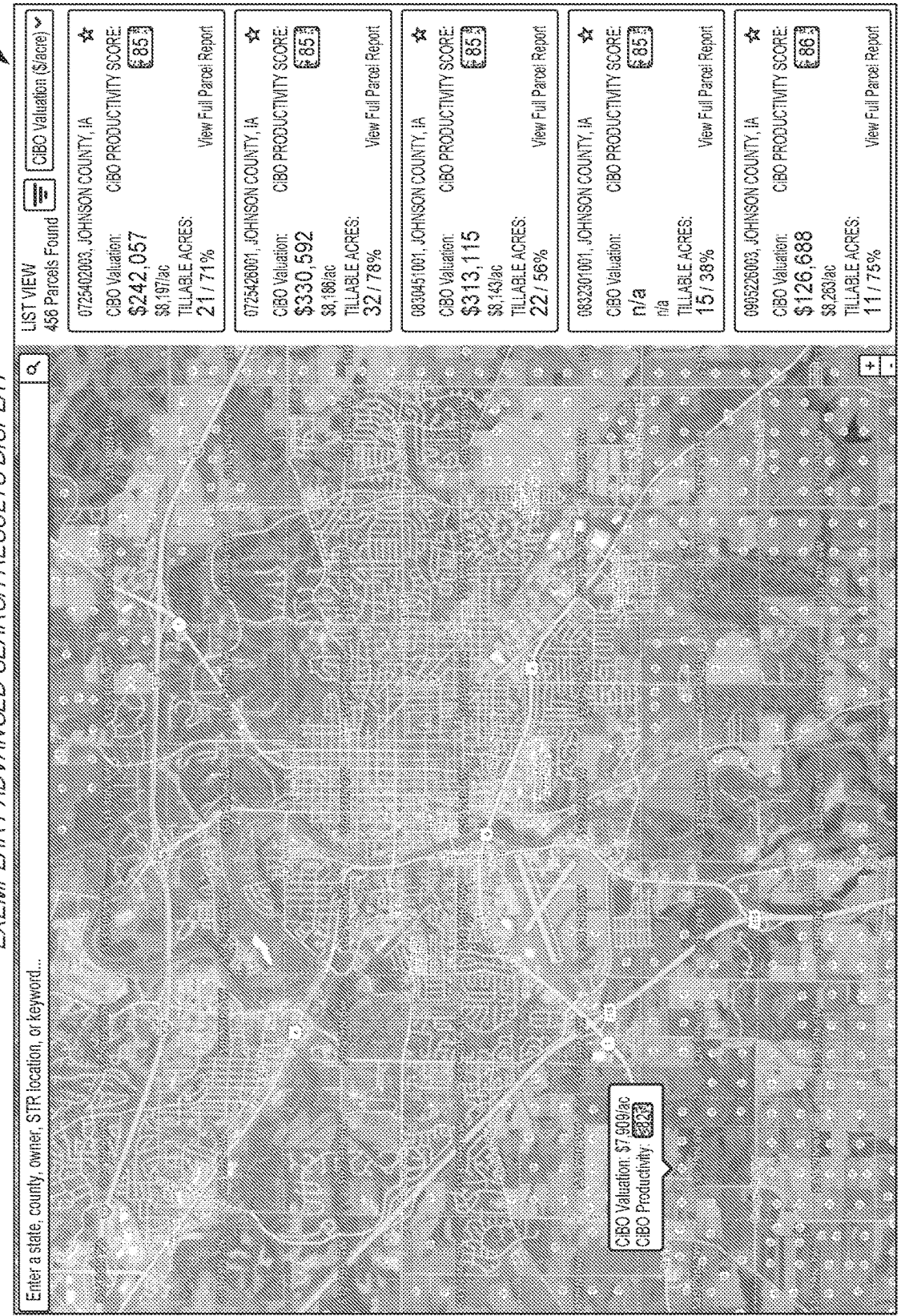
FIG. 14  EXEMPLARY ADVANCED SEARCH RESULTS DISPLAY

FIG. 15

EXEMPLARY PARCEL REPORT WITH VALUATION DETAILS DISPLAY

Back to search

View on map ☆ Favorite ⇗ Share

Parcel Report

S30 79N 6W, Johnson, IA
CiBo Valuation: $240,916
Value/Acre: $7,909/ac / Value/Tillable Acre: $7,909/ac Acres: 30 / Tillable Acres: 55%
2018 Crop: Soy Owner: MOSS, STEPHEN A
MOSS, SONYA S
See more with this owner
Contact owner

ASSESSMENT     DETAILS     IN SEASON

CiBO Valuation
$240,916
Value/Acre: $7,909/ac   Value/Tillable Acre: $7,909/ac

CiBO Valuation:
Estimated market value of a parcel.
$240,916

CiBO Productivity Score
Inherent productivity of the tillable land in a parcel.
82

CiBO Field Reliability Score
Observed performance zones within a parcel.
73

Sustainability Score
Environmental sustainability of farming a parcel.
26

Field History
10 year average bushels per acre
220 CORN | 66 SOY

How does this parcel compare?

THIS PARCEL
$7,909

$7,980
COUNTY AVERAGE

COUNTY LOW
$6,909

COUNTY HIGH
$8,911

Contributing Details
YEAR   PROPERTY TAXES   TAX ASSESSMENT
2019    $560             $38,100

Interested in learning more about CiBO's Valuation?
Check out how CiBO's Valuation works to capture the fair market value of land.
Learn more

*EXEMPLARY PARCEL REPORT WITH PRODUCTIVITY METRIC DETAILS DISPLAY*

Parcel Report

S30 79N 6W, Johnson, IA
CiBO Valuation: $240,916
Value/Acre: $7,909/ac / Value/Tillable Acre: $7,909/ac Acres: 30 / Tillable Acres: 55%
2018 Crop: Soy

Owner: MOSS, STEPHEN A
MOSS, SONYA S
See more with this owner
Contact owner

| ASSESSMENT | DETAILS | IN SEASON |

CiBO Productivity Score

82

A Productivity Score of 82 means that this parcel has a combination of environmental properties, like soil and weather, that make it potentially quite favorable for corn and soy production, when managed appropriately. Good yields and moderately low risk of crop failure can be expected under typical weather conditions.

How does this parcel compare?

THIS PARCEL
82

COUNTY LOW
72

COUNTY AVERAGE
84

COUNTY HIGH
92

Want to learn more about CiBO's Productivity Score?
Find out how CiBO's Productivity Score quantifies the inherent productivity of land.
Learn more CiBO Valuation:
*Estimated market value of a parcel.*
$240,916

CiBO Productivity Score
*Inherent productivity of the tillable land in a parcel.*
82

CiBO Field Reliability Score
*Observed performance zones within a parcel.*
73

Sustainability Score
*Environmental sustainability of farming a parcel.*
26

Field History
*10 year average bushels per acre*
CORN 220 | SOY 66

METHOD AND APPARATUS FOR GENERATION AND EMPLOYMENT OF PARCEL SUSTAINABILITY ATTRIBUTES FOR LAND PARCEL VALUATION

CROSS-REFERENCE TO RELATED APPLICATIONS

This application is related to the following co-pending U.S. patent applications, each of which has a common assignee and common inventors, the entireties of which are herein incorporated by reference.

| SER. NO. | FILING DATE | TITLE |
|---|---|---|
| 16/791,818 | Feb. 14, 2020 | METHOD AND APPARATUS FOR GENERATION AND EMPLOYMENT OF AGRO-ECONOMIC METRICS FOR LAND PARCEL VALUATION |
| 16/791,862 | Feb. 14, 2020 | METHOD AND APPARATUS FOR GENERATION AND EMPLOYMENT OF PARCEL PRODUCTIVITY ATTRIBUTES FOR LAND PARCEL VALUATION |
| 16/791,911 | Feb. 14, 2020 | METHOD AND APPARATUS FOR GENERATION AND EMPLOYMENT OF PARCEL PRODUCTION STABILITY ATTRIBUTES FOR LAND PARCEL VALUATION |
| 16/791,978 | Feb. 14, 2020 | METHOD AND APPARATUS FOR GENERATION OF LAND PARCEL VALUATION BASED ON SUPPLEMENTED PARCEL PRODUCTIVITY ATTRIBUTES |
| 16/791,997 | Feb. 14, 2020 | METHOD AND APPARATUS FOR GENERATION OF LAND PARCEL VALUATION TAILORED FOR USE |

BACKGROUND OF THE INVENTION

Field of the Invention

This invention relates in general to the field of agricultural land valuation, and more specifically to methods and apparatus valuation of agricultural parcels based upon inferred and estimated agricultural figures of merit supplemented by commercial sales prices of comparable parcels.

Description of the Related Art

The marketing and valuation of real property has consistently been at issue, though free market capitalism serves to easily resolve the valuation problem for residential and commercial properties. As one skilled in the art will appreciate, values for residential and commercial properties are generally based upon recent sales and tax assessments for similar surrounding properties. In a general sense, houses are houses and buildings are buildings. Houses have bedrooms, bathrooms, kitchens, garages, porches, and other features. Likewise, buildings have offices, parking, and conference rooms. Some properties are newer, and some are older. As one skilled in the art will appreciate, because similar properties have a specific use—families live in houses and workers work in offices—the value of a given property is generally determined primarily by the cost per square foot of surrounding properties of similar quality.

Whereas the marketing of residential and commercial properties was formerly exclusively performed by realtors who had exclusive access to multiple-listing services, since the advent of online services such as Zillow, Redfin, Reonomy, and LoopNet, user-friendly portals have been provided that enable buyers to enter search parameters for properties and access reports for selected properties that provide estimated values for the properties along with a significant amount of other helpful information. This information may include pictures, drawings, descriptions, and reviews of the properties, and may further include features of the properties (e.g., number of bedrooms and bathrooms), school district information, shopping that is close by, public transportation access, etc.

This application considers a different type of property, namely land that is used for agricultural purposes. In a broad sense, an agricultural parcel is land that worked in order to make a profit, and the type of work performed on a parcel may be the growing of crops (e.g., corn, soy, wheat, timber), raising of livestock (e.g., chickens, cattle, pigs, fish), or the extraction of products from livestock (e.g., dairies). As such, it is not as easy to estimate the value of a particular agricultural parcel using comparable sales prices alone, for the value of the particular parcel is highly correlated with the unique properties of that parcel to support the parcel's ability to be profitable. As one skilled in the art will appreciate, the profitability of agricultural parcels is a function of weather conditions, location and topography, how the productive activities have been previously managed, and how the productive activities are currently managed. As one skilled in the art will also appreciate, there is plethora of information of this sort that is both publicly and commercially available for particular parcels, but outside of the USDA Census data, the information differs from county to county and state to state. Some counties may have more data related to yield, while other counties will have more data related to management practices. The amount of data available is massive, but the present inventors have noted that there is no extant mechanism for comparing parcels that are in different counties/states because there is no common basis for making comparisons.

Though there are present-day platforms that provide for marketing of agricultural parcels, the present inventors note that such platforms rely solely on data that is common amongst all properties in a region. That is, the properties are marketed based upon their total and tillable acreage, primary/secondary crops, historical yields, comparable sales, and attributes that are common to all agricultural properties. However, the present inventors have noted a need in this field of technology to provide techniques and mechanisms that not only utilize all of the attributes that are common to these properties, but that also leverage the vast amount of science that is available to predict crop growth under forecasted weather and soil conditions, and that in addition are able to utilize predicted crop growth in conjunction with the massive amount of data that is not common for parcels in differing counties/states to generate objective metrics that enable an apples-to-apples comparison of a given parcel's ability to support production profitability in view of all of the parcels within a prescribed region, be that region county level, state level, or growing region (e.g., the Corn Belt).

Accordingly, what is needed is a method and apparatus for translating the vast amount of public data, commercial data, scientific data, and predicted crop growth data into agro-economic metrics that enable a user to make objective comparisons between similar agricultural parcels.

In addition, what is needed is a mechanism for employing these metrics as supplemented by commercial sales data in order to provide agricultural valuations for these parcels that expresses in dollars per acre the value of the properties in terms of their ability to support productive efforts.

What is further needed is a method and system that enables a user to determine which productive attributes of agricultural parcels are more important than others based upon the user's role (e.g., farmer, enterprise farming corporation, lending institution, insurer, etc.)

SUMMARY OF THE INVENTION

The present invention, among other applications, is directed to solving the above-noted problems and addresses other problems, disadvantages, and limitations of the prior art by providing a superior technique for employing a combination of public data, commercial data, field trial data, and crop simulation data to generate agro-economic metrics and objective valuations for a vast number of agricultural parcels. In one embodiment, a method for agricultural land parcel valuation is provided, the method comprising: accessing data corresponding to each of a plurality of parcels within a prescribed region, the data comprising corresponding management practices, corresponding historical weather conditions, corresponding locations and topography, corresponding remote sense images, corresponding soil types, and corresponding crop types; assessing and ranking the corresponding management practices for the each of the plurality of parcels; generating simulation inputs for the each of the plurality of parcels, where the simulation inputs comprise highest ranked corresponding management practices, the corresponding historical weather conditions, the corresponding locations and topography, the corresponding soil types, and the corresponding crop types; simulating crop growth for the each of the plurality of parcels over a prescribed number of previous years, where the simulating employs the simulation inputs provided by the generating; and employing selected outputs from said simulating to calculate agricultural metrics and a valuation corresponding to the each of the plurality of parcels, wherein the valuation for the each of the plurality of parcels is expressed relative to all of the plurality of parcels within the prescribed region, the agricultural metrics comprising a sustainability metric that comprises a function of an average of yearly sustainability component values, and wherein said yearly sustainability component values comprise yearly nitrogen leaching scores and yearly greenhouse gas emissions scores, and wherein said yearly nitrogen leaching scores and said yearly greenhouse gas emissions scores are calculated based upon outputs of said simulating crop growth for a corresponding year.

One aspect of the present invention contemplates a computer-readable storage medium storing program instructions that, when executed by a computer, cause the computer to perform a method for agricultural land parcel valuation, the method comprising: accessing data corresponding to each of a plurality of parcels within a prescribed region, the data comprising corresponding management practices, corresponding historical weather conditions, corresponding locations and topography, corresponding remote sense images, corresponding soil types, and corresponding crop types; assessing and ranking the corresponding management practices for the each of the plurality of parcels; generating simulation inputs for the each of the plurality of parcels, where the simulation inputs comprise highest ranked corresponding management practices, the corresponding historical weather conditions, the corresponding locations and topography, the corresponding soil types, and the corresponding crop types; simulating crop growth for the each of the plurality of parcels over a prescribed number of previous years, where the simulating employs the simulation inputs provided by the generating; and employing selected outputs from said simulating to calculate agricultural metrics and a valuation corresponding to the each of the plurality of parcels, wherein the valuation for the each of the plurality of parcels is expressed relative to all of the plurality of parcels within the prescribed region, the agricultural metrics comprising a sustainability metric that comprises a function of an average of yearly sustainability component values, and wherein said yearly sustainability component values comprise yearly nitrogen leaching scores and yearly greenhouse gas emissions scores, and wherein said yearly nitrogen leaching scores and said yearly greenhouse gas emissions scores are calculated based upon outputs of said simulating crop growth for a corresponding year.

Another aspect of the present invention envisages a system for agricultural land parcel valuation, the system comprising: an agricultural valuation server, configured to access data corresponding to each of a plurality of parcels within a prescribed region, the data comprising corresponding management practices, corresponding historical weather conditions, corresponding locations and topography, corresponding remote sense images, corresponding soil types, and corresponding crop types, the agricultural valuation server comprising: a management practices processor, configured to assess and rank the corresponding management practices for the each of the plurality of parcels, and configured to generate simulation inputs for the each of the plurality of parcels, where the simulation inputs comprise highest ranked corresponding management practices, the corresponding historical weather conditions, the corresponding locations and topography, the corresponding soil types, and the corresponding crop types; a crop simulation processor, coupled to the management practices processor, configured employ the simulation inputs to simulate crop growth for the each of the plurality of parcels over a prescribed number of previous years; an agricultural metrics processor, configured to employ selected outputs from said simulating to calculate agricultural metrics corresponding to said each of said plurality of parcels, said agricultural metrics comprising a sustainability metric that comprises a function of an average of yearly sustainability component values, and wherein said yearly sustainability component values comprise yearly nitrogen leaching scores and yearly greenhouse gas emissions scores, and wherein said yearly nitrogen leaching scores and said yearly greenhouse gas emissions scores are calculated based upon outputs of said simulating crop growth for a corresponding year; and a valuation processor, configured to employ selected outputs from the simulating to calculate a valuation corresponding to the each of the plurality of parcels, where the valuation is expressed relative to all of the plurality of parcels within the prescribed region.

BRIEF DESCRIPTION OF THE DRAWINGS

These and other objects, features, and advantages of the present invention will become better understood with regard to the following description and accompanying drawings where:

FIG. 14 is a diagram illustrating an exemplary advanced search results display according to the present invention such as might be presented by the client device of FIG. 11;

FIG. 15 is a diagram detailing an exemplary parcel report with valuation details display according to the present invention such as might be presented by the client device of FIG. 11;

FIG. 16 is a diagram detailing an exemplary parcel report with productivity metric details display according to the present invention such as might be presented by the client device of FIG. 11;

DETAILED DESCRIPTION

Figure 1:
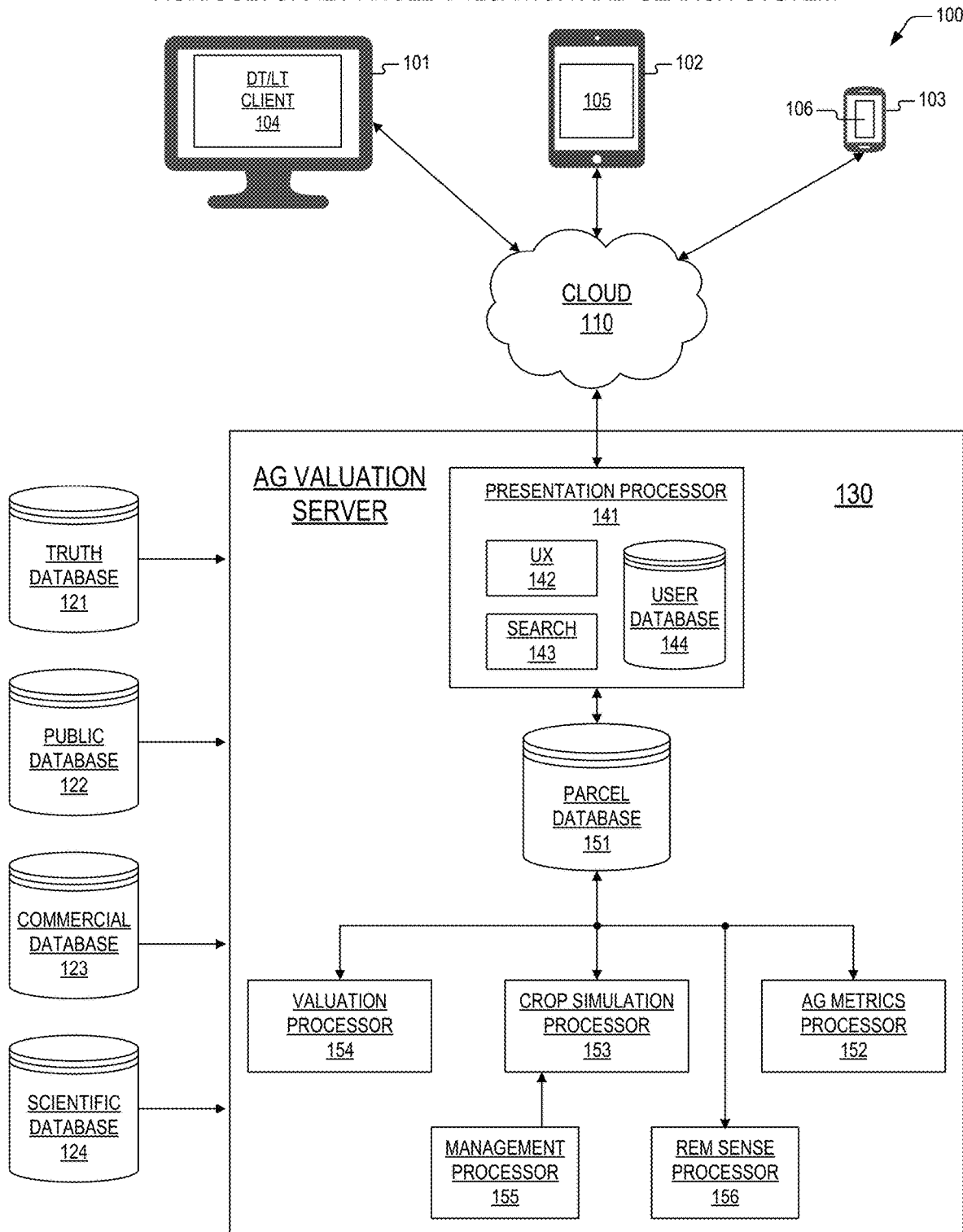
FIG. 1 is a block diagram illustrating an agricultural parcel valuation and search system according to the present invention.

Exemplary and illustrative embodiments of the invention are described below. It should be understood at the outset that, although exemplary embodiments are illustrated in the figures and described below, the principles of the present disclosure may be implemented using any number of techniques, whether currently known or not. In the interest of clarity, not all features of an actual implementation are described in this specification, for those skilled in the art will appreciate that in the development of any such actual embodiment, numerous implementation-specific decisions are made to achieve specific goals, such as compliance with system-related and business-related constraints, which vary from one implementation to another. Furthermore, it will be appreciated that such a development effort might be complex and time-consuming, but would nevertheless be a routine undertaking for those of ordinary skill in the art having the benefit of this disclosure. Various modifications to the preferred embodiment will be apparent to those skilled in the art, and the general principles defined herein may be applied to other embodiments. Therefore, the present invention is not intended to be limited to the particular embodiments shown and described herein but is to be accorded the widest scope consistent with the principles and novel features herein disclosed.

The present invention will now be described with reference to the attached figures. Various structures, systems, and devices are schematically depicted in the drawings for purposes of explanation only and so as to not obscure the present invention with details that are well known to those skilled in the art. Nevertheless, the attached drawings are included to describe and explain illustrative examples of the present invention. Unless otherwise specifically noted, articles depicted in the drawings are not necessarily drawn to scale.

The words and phrases used herein should be understood and interpreted to have a meaning consistent with the understanding of those words and phrases by those skilled in the relevant art. No special definition of a term or phrase (i.e., a definition that is different from the ordinary and customary meaning as understood by those skilled in the art) is intended to be implied by consistent usage of the term or phrase herein. To the extent that a term or phrase is intended to have a special meaning (i.e., a meaning other than that understood by skilled artisans) such a special definition will be expressly set forth in the specification in a definitional manner that directly and unequivocally provides the special definition for the term or phrase. As used in this disclosure, "each" refers to each member of a set, each member of a subset, each member of a group, each member of a portion, each member of a part, etc.

Applicants note that unless the words "means for" or "step for" are explicitly used in a particular claim, it is not intended that any of the appended claims or claim elements are recited in such a manner as to invoke 35 U.S.C. § 112(f).

Definitions

Central Processing Unit (CPU): The electronic circuits (i.e., "hardware") that execute the instructions of a computer program (also known as a "computer application," "application," "application program," "app," "computer code," "code process," "code segment," or "program") by performing operations on data that may include arithmetic operations, logical operations, and input/output operations. A CPU may also be referred to as a processor In view of the above background discussion on how agricultural land parcels are presently valued, a discussion of the present invention will be provided with reference to FIGS. 1-18. The present invention overcomes the problems associated with present-day techniques by providing methods and apparatus that translate commercial and public data, remotely sensed data, topography data, farm management practices, field trials data, and crop simulation data into agriculturally meaningful metrics and corresponding objective agricultural valuations for parcels relative to all other parcels within a growing region that enable different classes of users, as a function of user role, to make decisions on selected parcels more accurately than has heretofore been provided for by present-day valuation techniques.

Referring to FIG. 1, a block diagram is presented illustrating an agricultural parcel valuation and search system 100 according to the present invention. The system 100 may include an agricultural valuation server 130 that is coupled to one or more client devices 101-103 through the internet cloud 110. The client devices 101-103 may include one or more desktop/laptop computers 101 that execute desktop/laptop client applications 104 for communication and interaction with the valuation server 130 through the internet cloud 110. The client devices 101-103 may also include one or more smart tablet computers 102 that execute tablet client applications 105 for communication and interaction with the valuation server 130 through the internet cloud 110. The client devices 101-103 may further include one or more smartphone devices 103 that execute smartphone client applications 106 for communication and interaction with the valuation server 130 through the internet cloud 110.

The valuation server 130 is coupled to a truth database 121, a public database 122, a commercial database 123, and a scientific database 124. Though represented in the block diagram as single databases 121-124, each of the databases 121-124 may comprise a substantial number of databases through which the valuation server 130 may access truth-based data, public data, commercial data, and scientific data in order to translate this data into agriculturally meaningful metrics and valuations for a vast number of agricultural parcels.

Preferably, truth-based data includes field trial results that are the measurements taken by farming partners who plant and harvest crops under a wide range of specified scenarios. These field trial results are employed by the valuation server to test and improve the accuracy of crop simulations that may be performed to generated metrics and valuations for similar parcels, and that are employed to scale simulations to entire growing regions.

Public data comprises a wide variety of sources such as, but not limited to, county records, United States Department of Agriculture monthly reports; parcel geographic coordinates data and topography; soil types and layering (e.g., Soil Survey Geographic Database (SSURGO); historical crop planting harvesting, and yield data; soil type indexes (e.g., Corn Stability Rating 2 (CSR2); historical and historical and forecasted weather data; and satellite and aerial image data taken across agriculturally meaningful spectral band (e.g., LANDSAT, SENTINEL) that may be processed by the valuation server 130 to understand crop types, rotations, key management practices (e.g., planting dates, tillage dates, fertilization dates, harvesting dates), and stages of growth at any given time.

Commercial data may comprise any of the public data that is aggregated or formatted for ease of access by the valuation server 130.

Scientific data may comprise selected results of global scientific results taken from published literature. The results are provided to the valuation server 130 to validate crop simulations and to ensure that the simulations are accurate across a wide range of management scenarios and weather conditions. In one embodiment, crop simulation results are compared to scientific research data obtained under similar management practices and weather conditions.

The agricultural valuation server 130 may include a presentation processor 141 that is coupled to a parcel database 151. The presentation processor 141 comprises a user interface (UX) component 142, a search engine component 143, and a user database 144.

The valuation server 130 may further comprise an agricultural metrics processor 152, a crop simulation processor 153, and a valuation processor 154, all of which are coupled to the parcel database 151. The valuation server 130 may further comprise a remote sense processor 156 that is coupled to a management practices processor 155 and to the agricultural metrics processor 152. The management practices processor 155 is coupled to the crop simulation processor 153.

In operation, records corresponding to agricultural parcels in a region are created, iterated, and revised as a function of newly available data from one or more of the databases 121-124 and applicable results from recent crop simulations performed by the crop simulation processor 153. The records are stored in the parcel database 151 for access by the agricultural metrics processor 152, the valuation processor 154, and the presentation processor 141. Users may execute the client applications 104-106 on the client devices 101-103 to specify constraints, weights, and search parameters for one or more parcel records stored within the parcel database 151. The user interface processor 142 executes in order to transmit display windows to the client devices 101-103 via their respective client applications 104-106 to enable the users to specify the constraints, weights, and search parameters. The client applications 104-106 may transmit the constraints, weights, and search parameters to the presentation processor 141 through the internet cloud 141. In one embodiment, the constraints, weights, and search parameters are stored in corresponding user records within the user database 144 to accelerate subsequent searches. Upon receipt of the constraints, weights, and search parameters, the search engine processor 143 employs the corresponding user records to access one or more records within the parcel database 151 that satisfy the constraints, weights, and search parameters. The one or more records within the parcel database 151 that satisfy the constraints, weights, and search parameters may also be stored in corresponding user records within the user database 144 to accelerate subsequent searches, and the one or more records within the parcel database 151 that satisfy the constraints, weights, and search parameters are provided by the search engine processor 143 to the user interface processor 142, which formats the one or more records for display by the client applications 104-106 on the client devices 101-103 according to device type, and the presentation processor transmits the one or more records to the client devices 101-103 along with contextual metadata corresponding to the one or more parcels (e.g., parcels shown on a map) that enable the users to visualize and better comprehend results of their searches.

In one embodiment, users may iteratively refine searches by specifying additional constraints, weights, and search parameters to further target search results that are of interest, and these results are additionally stored in the corresponding user records within the user database 144.

Upon selection of a specific parcel record, the presentation processor 141 may transmit fields within the records that are formatted by the user interface processor 142 for display to the user along with metadata that enable the user to visualize and comprehend the record fields associated with the parcel, thus providing the user with a substantially improved method for making an informed decision regarding a corresponding agricultural parcel based upon user category (e.g., small farmer, enterprise farming corporation, underwriter, lender, insurer, etc.).

The remote sense processor 156 may process satellite/aerial images, and may merge selected images to determine vegetative indices, to estimate missing image data, and to determine parcel crop stability zones. The management practices processor 155 may access data from the databases 121-124 corresponding to management practices associated with parcels and rank the outputs against other management practice data that is received from one or more of the databases 121-124. In turn, the management practices processor 155 may augment sparse or incomplete data in order to provide location-specific inferences for a number of key crop management practices including, but not limited to planted crop type, specific cultivar or crop variety, planting data, planting density (i.e., seeds per acre and row spacing), fertilizer application (e.g., dates and amounts), and irrigation practices. In one embodiment, highest ranked management practices are employed to construct simulation inputs to the crop simulation processor 153 for modeling of required multi-year crop simulations. For example, management practices from the truth database 121 may be ranked higher than crop simulation results. In the absence of truth data for a parcel, state guidelines or management practices rules of thumb may be employed to build directives for simulations.

The results of the crop simulations are employed by the agricultural metrics processor 152 and the valuation processor 154 to iteratively translate simulation results and data provided by the databases 121-124 into figures of merit and an agricultural valuation for every parcel within the parcel database 151. In one embodiment, the number of parcel records in the parcel database 151 comprises in excess of 20 million parcels located in the United States.

In one embodiment, the crop simulation processor 153 preferably comprises a mechanistic crop model such as the Systems Approach to Land Use Suitability (SALUS), the initial version of which was developed at Michigan State University and which has been the subject of 20 years of testing across hundreds of fields in 46 countries, more than 25 PhD dissertations, over 200 peer-reviewed journal articles, and thousands of academic citations. It is not the purpose of the present application to provide an in depth tutorial on mechanistic crop modeling, but rather to disclose how results of crop simulations performed by crop simulation processor 153 are translated into agricultural metrics and a corresponding agricultural valuation that enables a user to make informed and meaningful decisions for one or more parcels. For a tutorial on SALUS, the reader is directed to the publications below:

Basso, B., & Ritchie, J. T. (2015). Simulating crop growth and biogeochemical fluxes in response to land management using the SALUS model. In S. K. Hamilton, J. E. Doll, & G. P. Robertson (Eds.), *The ecology of agricultural landscapes: long-term research on the path to sustainability*. New York, N.Y., USA: Oxford University Press, 252-274;

Basso, B., Ritchie, J. T., Grace, P. R., Sartori, L. (2006). Simulation of tillage systems impact on soil biophysical properties using the SALUS model. *Italian Journal of Agronomy*, 1(4), 677. doi: 10.4081/ija.2006.677;

Albarenque, S. M., Basso, B., Caviglia, O. P., Melchiori, R. J. (2016). Spatio-temporal nitrogen fertilizer response in maize: field study and modeling approach. *Agronomy Journal*, 108(5), 2110. doi: 10.2134/agronj2016.02.0081; and Partridge, T. F., Winter, J. M., Liu, L., Kendall, A. D., Basso, B., Hydnman, D. (2019). Mid-20th century warming hole boosts U.S. maize yields. *Environmental Research Letters*. doi: 10.1088/1748-9326/ab422b The present inventors note that the crop simulation processor 153 according to the present invention is continuously improved as a function of new scientific and truth data in order to expand to different crop types and to provide scaling to address practical needs of agriculture from sub-field to continental scales. The aforementioned crop model is a subset of a larger simulation engine within the crop simulation processor 153 which uses a combination of farmer reported data, government and academic statistics, and remote sensing to build a detailed scenario that describes genotypic conditions (i.e., crop parameters representing genotypic potentials of a crop), environmental conditions (i.e., weather, physical soil properties, and chemical soil properties), and management conditions (e.g., planting dates, fertilizer application dates and amounts, tillage date, depth, and material, etc.) of a growing crop. Based on these input conditions, the crop model calculates plant growth stage, plant leaf area, solar energy absorbed through the leaves, biomass accumulated in different plant tissues, and water and nutrient uptake by the roots, and saves outputs for that day. These variables are calculated at every time step until the crop matures.

Accordingly, the crop simulation processor 153 is configured to describe development and growth of a crop within an agricultural parcel all the way from planting to maturity. Plant development describes the timing of events that occur during the plant life cycle that induce changes in growth rates and partitioning of dry matter to different plant tissues. The simulation processor 153 calculates state variables representing various aspects of development and growth at each daily time step and furthermore describes the different components of the soil layers and how these interact with the environment. Thus, the crop simulation processor 153 may estimate the amount of water and nutrients available for uptake by a growing plant. Root development occurs at each daily time step: root tips progress through the soil layers, and root mass increases. This results in water and nutrient uptake in soil horizons that are in contact with the plant's rooting system, proportional to the root mass distribution in each soil horizon. Advantageously, the crop simulations performed by the crop simulation processor 153 reflect the complex interactions whereby soil and weather influence plant growth and how plant growth subsequently changes the soil dynamic. Outputs of the crop simulation processor 153 include, but are not limited to, yields, nitrogen stress, drought stress, biomass accumulation, growth stages, nitrogen uptake, nitrogen use efficiency, and water use efficiency.

In one embodiment, constraints, weights, and search parameters that a user may specify to access parcel records in the parcel database 151 include, but are not limited to, growing region, state, county, zip code, Public Land Survey System (PLSS), keywords, parcel owner name, historical land use (e.g., crop type), land type (e.g., farm, dairy, ranch, forest, etc.), parcel acreage, tillable area, and agricultural metrics and valuations generated by the valuation server 130.

As will be described in further detail below, the agricultural metrics and agricultural valuations generated by the agricultural valuation server 130 enable a user functioning in a specific role (e.g., farmer, enterprise, underwriter, etc.) to understand the value of a particular parcel from the user's perspective, which is a significant improvement over present-day techniques that merely employ sales of comparable parcels. Depending on the user's role, agricultural metrics may be expressed as productivity of a parcel, production risk of the parcel, and the parcel's ability to be sustainably managed. For a user purely interested in farming, a parcel's productivity and stability (i.e., productivity risk) are paramount. However, for an enterprise that is focused on reducing carbon emissions, a different metric (e.g., sustainability) may take precedence. In one embodiment, the agricultural valuation assigned to a parcel employs one or more of the agricultural metrics as a function of the user's role as supplemented by comparable sales to express an agricultural value in dollars as opposed to just a value that is based on comparable parcels. Advantageously, the user is exposed to a valuation of a parcels based upon the parcel's agricultural potential, which is a substantial improvement over that which has heretofore been provided.

Figure 10:
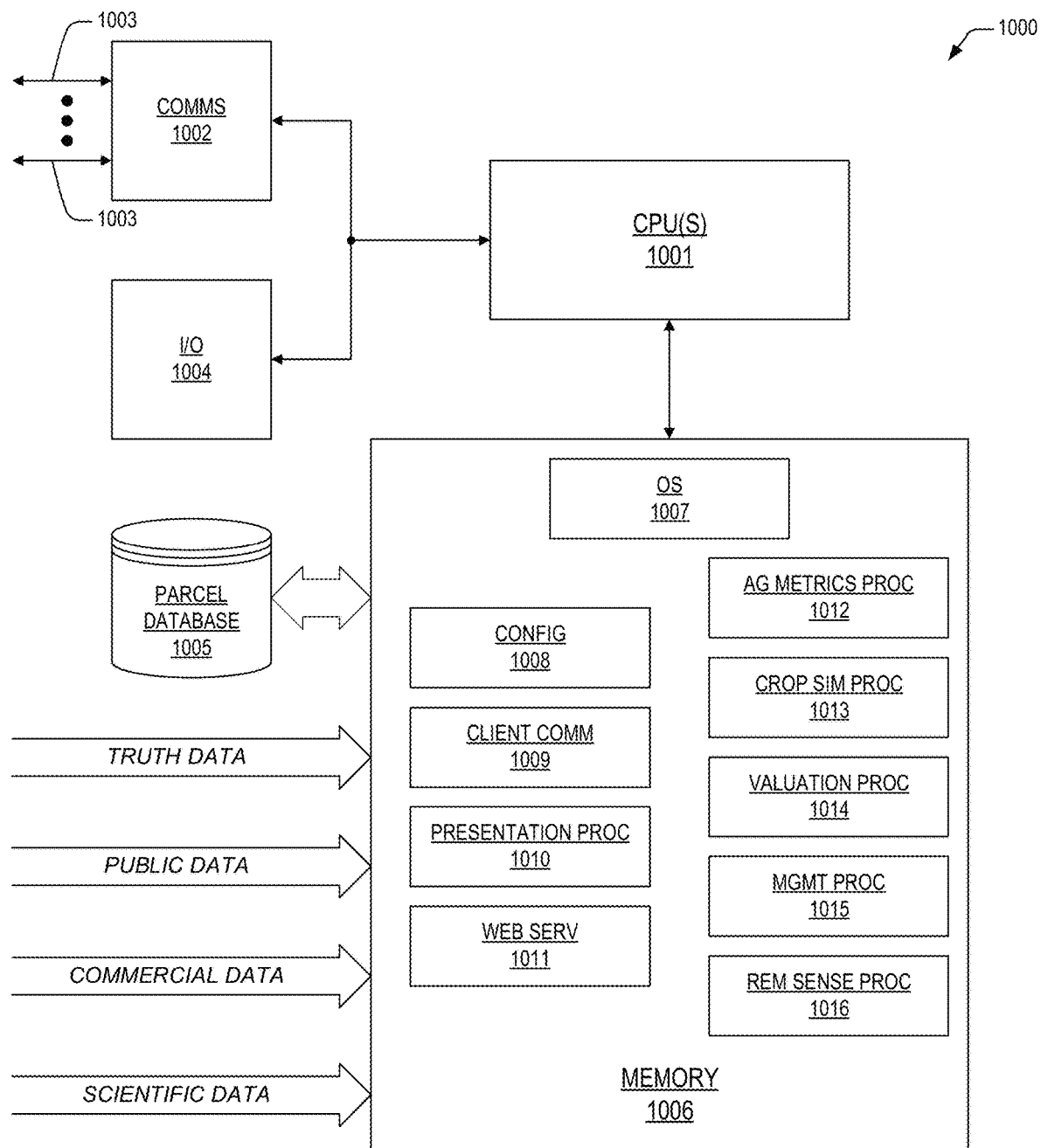
FIG. 10 is a block diagram illustrating an agricultural valuation server according to the present invention.

The valuation server 130 according to the present invention may comprise one or more application programs executing thereon to perform the operations and functions described above, and which will be disclosed in further detail with reference to FIG. 10.

Figure 2:
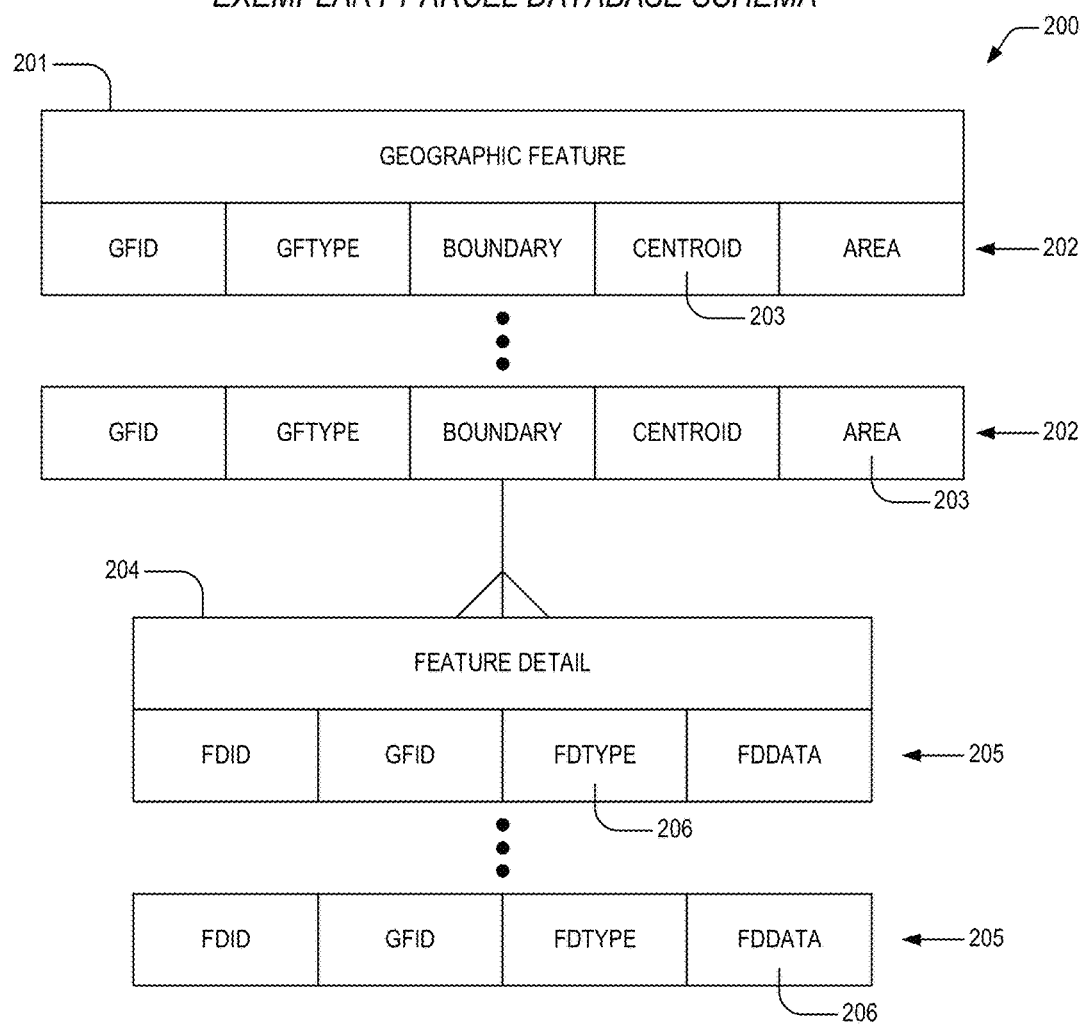
FIG. 2 is a block diagram depicting an exemplary schema for a parcel database according to the present invention.

Turning now to FIG. 2, a block diagram is presented depicting an exemplary schema for a parcel database 200 according to the present invention, such as the the parcel database 151 of FIG. 1. The schema 200 may include a geographic feature table 201 that is linked to a plurality of feature detail tables 204 in a one-to-many architecture. The geographic feature table 201 may include a plurality of records 202 having a plurality of data fields 203. Each of the feature detail tables 204 may include a plurality of records 205 having a plurality of data fields 206. The plurality of data fields 203 in each of the geographic feature records 202 include a geographic feature ID field (GFID), which is the primary key for the geographic feature table 201 and which is unique for each of the plurality of records 202. The plurality of data fields 203 in each of the geographic feature records 202 additionally include a geographic feature type field (GFTYPE), a boundary field (BOUNDARY), a centroid field (CENTROID), and an area field (AREA). GFTYPE specifies one of a plurality of geographic feature types that include, but are not limited to, parcel, county, state, and growing region. BOUNDARY includes geographic coordinates (e.g., longitude and latitude) that describe a geographic boundary for the land area corresponding to the GFID. CENTROID includes a geographic centroid coordinates for the land area corresponding to the GFID. And AREA includes the area (e.g., acres, square meters, etc.) of the land area corresponding to the GFID.

The plurality of data fields 206 in each of the feature detail records 205 include a feature detail ID field (FDID), which is the primary key for a corresponding feature detail table 204 and which is unique for each of the plurality of records 205. Each of the feature detail records 205 may also include a geographic feature type ID field (GFID), which is the foreign key that links a feature detail record 205 back to a corresponding geographic feature record 202 in the geographic feature table 201. Each of the feature detail records 205 may further include a feature detail type field (FDTYPE) and a feature detail data field (FDDATA). FDTYPE specifies one of a plurality of feature detail types that include, but are not limited to, results generated by the crop simulation processor 153 for the corresponding FDID and GFID combination, a particular agricultural metric (e.g., productivity score, stability score, sustainability score) generated by the agricultural metrics processor 152 for the corresponding FDID and GFID combination, an agricultural valuation generated by the valuation processor 154 for the corresponding FDID and GFID combination, stability zone boundaries generated by the remote sense processor 156 for the corresponding FDID and GFID combination, and descriptive metadata taken from the databases 121-124 for the corresponding FDID and GFID combination.

Accordingly, a given geographic feature (e.g., a 40-acre farm in Milford County, Iowa) may be described in the parcel database 151 in terms of its geographic boundary, centroid, and area within a record 202 in the geographic feature table 201, and this record 202 may be linked to a number of feature detail records 205 in different feature detail tables 204 that contain feature detail data for a corresponding number of feature detail types.

As one skilled in the art will appreciate, deciphering the history and potential of a parcel is critical to understanding the parcel's ultimate economic value; however, this type of information is typically not available outside of hard-to-come-by operator data, and without access to this data, those interested in valuing a parcel are typically limited to public soil maps and state-level productivity rankings, which are inadequate for representing actual field conditions. In addition, one skilled in the art will appreciate that most states don't have a consistent productivity score that allows for comparison of parcels across states, and that state productivity scores are based on historical information of weather and soil. In contrast, the metrics and valuations provided for by the present invention are 1) consistent and 2) based upon topography, soil, and crop simulations that are validated by remote sensing in test fields.

Figure 3:
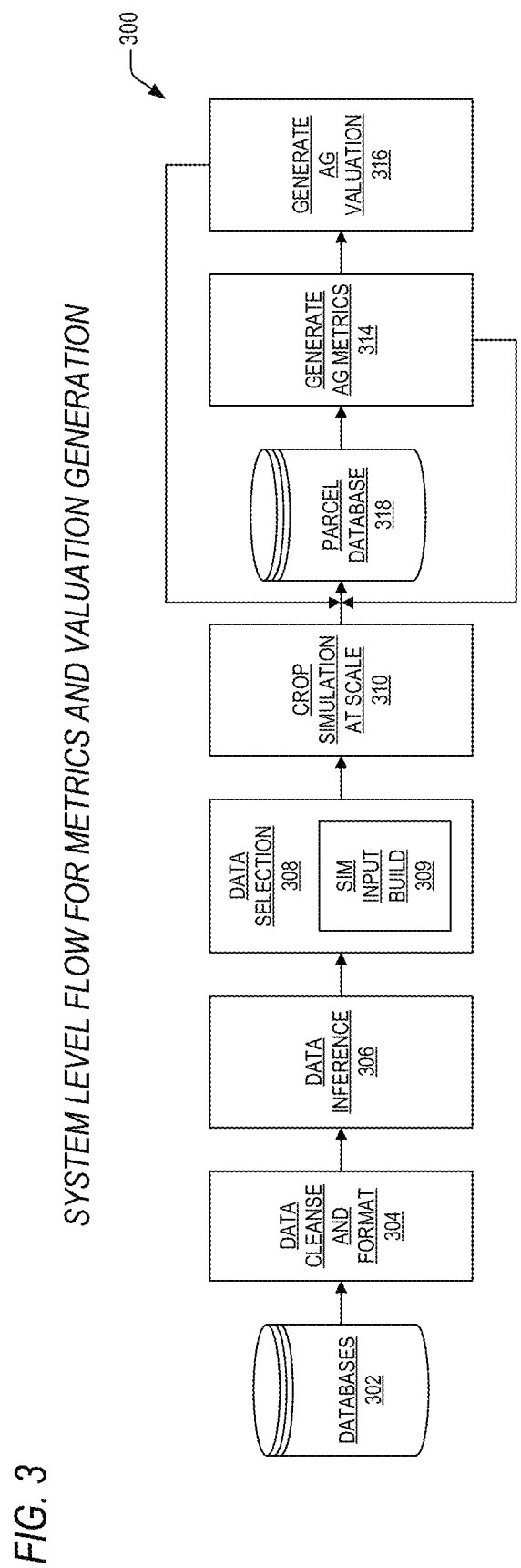
FIG. 3 is a block diagram featuring system level flow for valuation and generation of metrics associated with agricultural parcels within a prescribed growing region.

Referring now to FIG. 3, a flow diagram is presented featuring system level flow for valuation and generation of metrics associated with agricultural parcels within a prescribed growing region, such as might be performed by the agricultural valuation server 130 of FIG. 1, and such as might be stored in the exemplary parcel database records 200 of FIG. 1. Flow begins at block 304 where databases 302 are accessed and data therefrom is cleansed of error and formatted for analysis and simulation. In one embodiment, the databases 302 comprise the databases 121-124 of FIG. 1. As one skilled in the art will appreciate, one of the most challenging issues associated with the processing of so-called "big data" is handling lots of data from different sources that is formatted differently, updated differently, and that contains different types of errors. Accordingly, the accessing, cleansing, and formatting data in block 304 may comprise a core set of steps for each data source, namely downloading the data, assessing and cleansing the data, and formatting and storing the data.

The downloading step may comprise automating downloads for those data sources that require more frequent updates. For example, irrigation data may only have to be downloaded once a year, but weather data has to be downloaded daily. In addition, for data that is retroactively updated due to more accurate sources, the automation task may comprise downloading more recent days in the past, comparing their data to current downloads of those days, and continuing to update the data until it stabilizes.

The downloading step may additionally comprise automating ingestion of different data formats such as, but not limited to, CSV or Excel files, public database formats, scanned images, Power Point files, and PDF files.

Once download, the data is assessed and cleansed, which may comprise removal of duplicate information, inferring missing values, substituting for unconventional characters and symbols, and removal of outlier values (e.g., tax assessment data having extra zeros). For data that will be ingested regularly, the present invention contemplates automation of assessment and cleansing. Inference of missing values may comprise employing alternative data (e.g., using state/national average management practices in situations where county records lack such data). It is noted that assessment and cleansing of satellite/aerial data is particularly challenging since clouds or other obstacles may obscure images. In one embodiment, the assessing and cleansing step comprises automated processes to filter out images with obscured data.

The formatting and storage of the data may include determination of whether data may be stored in a single file or may require a database or file store (e.g., Amazon Simple Storage Service). Preferably small amounts of data are stored as files, such as county-level USDA data) and large amounts of data (e.g., weather data, satellite/aerial imagery, field trials data, and parcel metadata) are stored in databases which are accessed via a microservice architecture. One example of such is a service that accepts parcel boundaries to access soil zones for a given parcel. Another example is a service that accepts parcel boundaries to access the yearly weather for the given parcel.

At block 306, data that has been cleansed and formatted in block 304 is analyzed for each parcel to generate inferences regarding a number of attributes that include, but are not limited to, crop types, rotations, key management practices (e.g., planting dates, tillage dates, fertilization dates, harvesting dates), and stages of crop growth at any given time. These inferences may be generated by the management practices processor 155 of FIG. 1, and are provided to the data selection block 308.

At the data selection block 308, the generated parcel attributes along with other data necessary for simulation of crops corresponding to all of the parcels are selected on a parcel by parcel basis. A subset of data selection may comprise building a list of inputs to a crop simulation model within the crop simulation processor 153 of FIG. 1. The process of building simulation inputs is shown in block 309 and may also comprise a set of directives that guide building of the simulation inputs according to best practices for parcels within a given area. Preferably, the simulation inputs are built according to automated directives that rely solely on inferred data, without human intervention. In one embodiment, data selection provides for the combination of known and inferred data that includes management practices, soil data, and weather data (including long-term forecasts) according to the set of directives. From these directives, the data selection block 308 produces a complete input set for crop simulation. Flow then proceeds to block 310.

At block 310, the simulation inputs for all parcels within a prescribed region are provided to the crop simulation processor 153, which executes crop simulations for respective crops corresponding to each of the parcels over a period of years, where the crops and number of years are provided by the simulation inputs. In one embodiment, the prescribed region may be the entire United States. In another embodiment, the prescribed region may be a specific growing region (e.g., the Corn Belt, the Wheat Belt). In a further embodiment, the prescribed region may comprise a given state (e.g., Iowa). In yet another embodiment, the prescribed region may comprise a county (e.g., Marshall County, Iowa). Though the prescribed regions are preferably associated within parcels within the United States, the present inventors note that the system 100 according to the present invention may be adapted for practice within any country in the world. Thus, according to the inputs provided by block 308, crop simulations are run at scale by the crop simulation processor 153 to generate parcel yields per planting season along with a number of other corresponding simulation outputs such as, but not limited to, plant growth stage, plant leaf area, solar energy absorbed through the leaves, biomass accumulated in different plant tissues, and water and nutrient uptake by the roots. In one embodiment, crop growth is simulated daily and outputs for each day are saved and employed as parameters for the next growing day. These variables are calculated at every time step until a crop for each parcel matures. In one embodiment, the crop simulation processor 153 is configured to perform millions of crop simulations in hours and is configured to run simulations for corn, soybeans, cotton, or wheat on any agricultural location in the U.S. The simulation results are stored in the parcel database 318. Flow then proceeds to block 314.

At block 314, the agro-economic metrics processor 152 accesses the database 318 and employs the simulation results to generate a plurality of agro-economic metrics for every parcel in the parcel database 318. Some of the plurality of metrics, as will be described in further detail below, may exclusively employ simulation outputs while others of the metrics may employ simulation outputs in combination with data retrieved from the databases 302. Some of the metrics may not require simulation outputs, but rather may utilize satellite/aerial image data. Some of the metrics may be iteratively generated as is shown in the diagram 300, while other metrics may be directly generated. In one embodiment the following agro-economic metrics are generated at block 314:

- a productivity score for each parcel that is expressed as a value from 0 to 100 relative to all other parcels within a prescribed region;
- a stability (or, "field reliability") score for each parcel that is expressed as a value from 0 to 100 relative to all other parcels within a prescribed region; and
- a sustainability score for each parcel that is expressed as a value from 0 to 100 relative to all other parcels within a prescribed region.

The productivity score is a measure of the ability of a particular parcel to support crop production under common management practices in its historical environment. In this context, productivity is the outcome of interactions among the main components of a crop production system that impact crop performance, namely weather, soil, and management practices. The stability score is a measure of the risk associated with producing crops on the particular parcel of land over a range of years. The sustainability score is a measure of a parcel's ability to sustainably grow crops over a range of years. Flow then proceeds to block 316.

At block 316, the valuation processor 154 accesses the metrics generated at block 314 along with data from the databases 302 and calculates an agricultural value for each of the parcels that considers the relative scoring of the agricultural metrics as supplemented by comparable sales of surrounding parcels. In one embodiment, as will be described in further detail below, the productivity score for each parcel is employed in conjunction with productivity scores for surrounding parcels along with USDA census and sales data to generate an objective valuation of each parcel that is expressed in dollars per acre. Other embodiments contemplate employment of other and/or additional agricultural metrics to arrive at an agricultural valuation that is meaningful to a given user's role (e.g., farmer, enterprise farm, banking, underwriting). Further embodiments envision the employment of weighted agricultural metrics to generate an agricultural valuation that is meaningful to a given user's role. The agricultural metrics generated at block 314 along with the agricultural valuation(s) for each of the parcels are then stored in the parcel database 318 along with other parcel data as is described above with reference to FIGS. 1-2.

Figure 4:
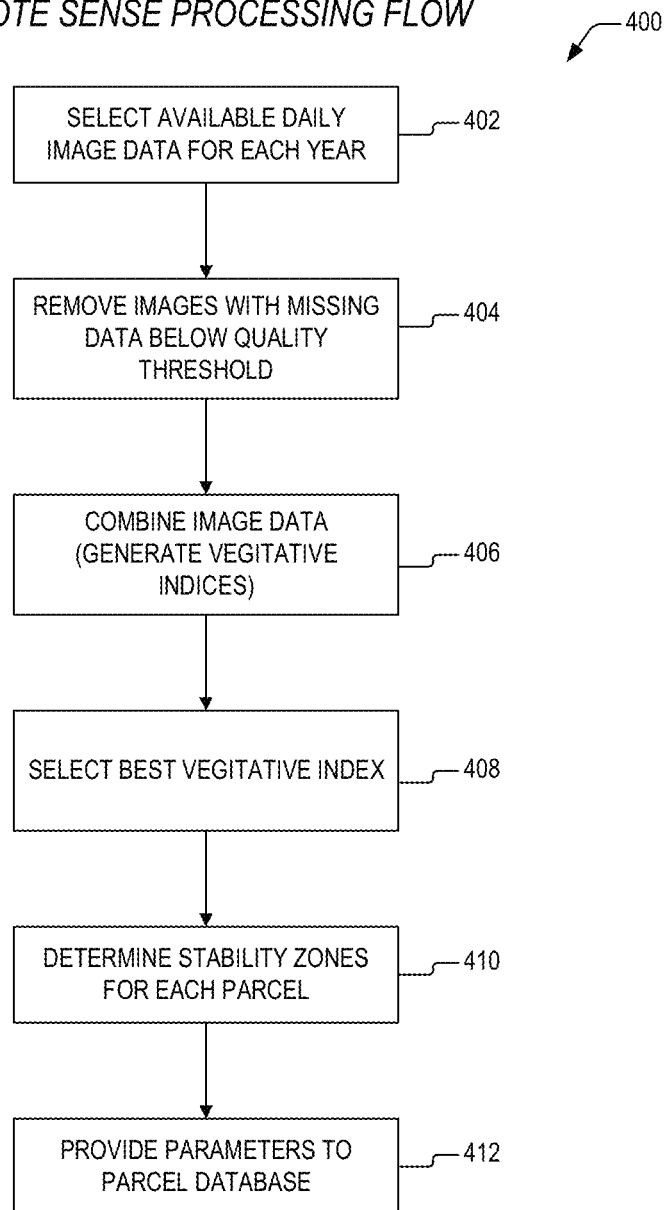
FIG. 4 is a flow diagram showing processing of remote sensed data for determination of stability zones within a parcel.

Turning now to FIG. 4, a flow diagram 400 is presented showing processing of remote sensed data for determination of stability zones within a parcel, such as may be performed by the remote sense processor 156 of FIG. 1. In one embodiment, the remote sense processor 156 processes satellite and/or aerial images to generate data for parcels that include a plurality of zones within a parcel that have differing levels of production stability in view of historical crop production. In one embodiment, the remote sense processor 156 processes satellite and/or aerial images to generate data for parcels that include four zones within a parcel that have differing levels of production stability in view of historical crop production. Other numbers of stability zones are contemplated.

Flow begins at block 402, where the remote sense processor 156 employs public data to determine a boundary within each of the parcels that includes the most common crop type within that parcel and selects available daily (or less frequent) image data for parcels within a prescribed region, as noted above. The image data may be from the public database 122 or the commercial database 123. As described above, the images are downloaded, assessed and cleansed, and stored. Flow then proceeds to block 404.

At block 404, images that have missing data (e.g., covered by clouds) below a prescribed quality threshold are removed and images with missing data above the prescribed quality threshold are retained. Some of the missing data in the retained images may be estimated by time-processing data from other time-adjacent images which include that data. Flow then proceeds to block 406.

At block 406, relevant spectral bands for a given observation are combined to generate vegetative indices for subparts of the parcels according to well-known techniques. In one embodiment, the technique includes the normalized difference vegetation index (NDVI). Another technique includes the enhanced vegetation index (EVI). In one embodiment, red, green, blue, and near-infrared spectral bands are combined. Flow then proceeds to block 408.

At block 408, the remote sense processor 56 identifies a best vegetative index image for each of the parcels for each of a number of prescribed years. In one embodiment, one of the images within a given year is selected as the best vegetative index image by summing all of the intensities for each valid pixel within the vegetative index image and selecting the image that has the highest valid pixel sum. Valid pixels are those that 1) have an actual intensity value and 2) are not covered by clouds. As one skit led in the art will appreciate some pixels within an image will have a "no data" value due to a number of possible reasons, such as malfunctions of the imaging system itself.

At block 410, stability zones within each of the parcels are determine d by the remote sense processor 156 from all of the available best vegetative index images via a stability zone determination algorithm that will be described in more detail with reference to FIG. 7. The result of applying this algorithm is a Ingle composite image where each pixel in the image represents one of the plurality of stability classes. In one embodiment that contemplates two stability classes, the classes include stable and unstable. In another embodiment that contemplates four stability classes, the classes include high-stable, medium-stable, low-stable, and unstable. In addition, as one skilled in the art will appreciate, certain pixels within an image may be categorized as undefined, indicating that those pixels are invalid for purposes of determining stability zones.

The concept of agricultural stability zones is well known. For more information, the reader is referred to the following publications:

Maestrini, B., Basso, B. Drivers of within-field spatial and temporal variability of crop yield across the US Midwest. *Sci Rep* 8, 14833 (2018). https://doi.org/10.1038/s41598-018-32779-3

Basso, B., Shuai, G., Zhang, J. et al. Yield stability analysis reveals sources of large-scale nitrogen loss from the US Midwest. *Sci Rep* 9, 5774 (2019). https://doi.org/10.1038/s41598-019-42271-1

Maestrini, B., Basso, B. Drivers of within-field spatial and temporal variability of crop yield across the US Midwest. Sci Rep 8, 14833 (2018). https://doi.org/10.1038/s41598-018-32779-3

Once the stability zones for each of the parcels are determined, flow then proceeds to block 412.

At block 412, the stability zones are provided to the parcel database 151 for access by the agricultural metrics processor 152.

Figure 5:
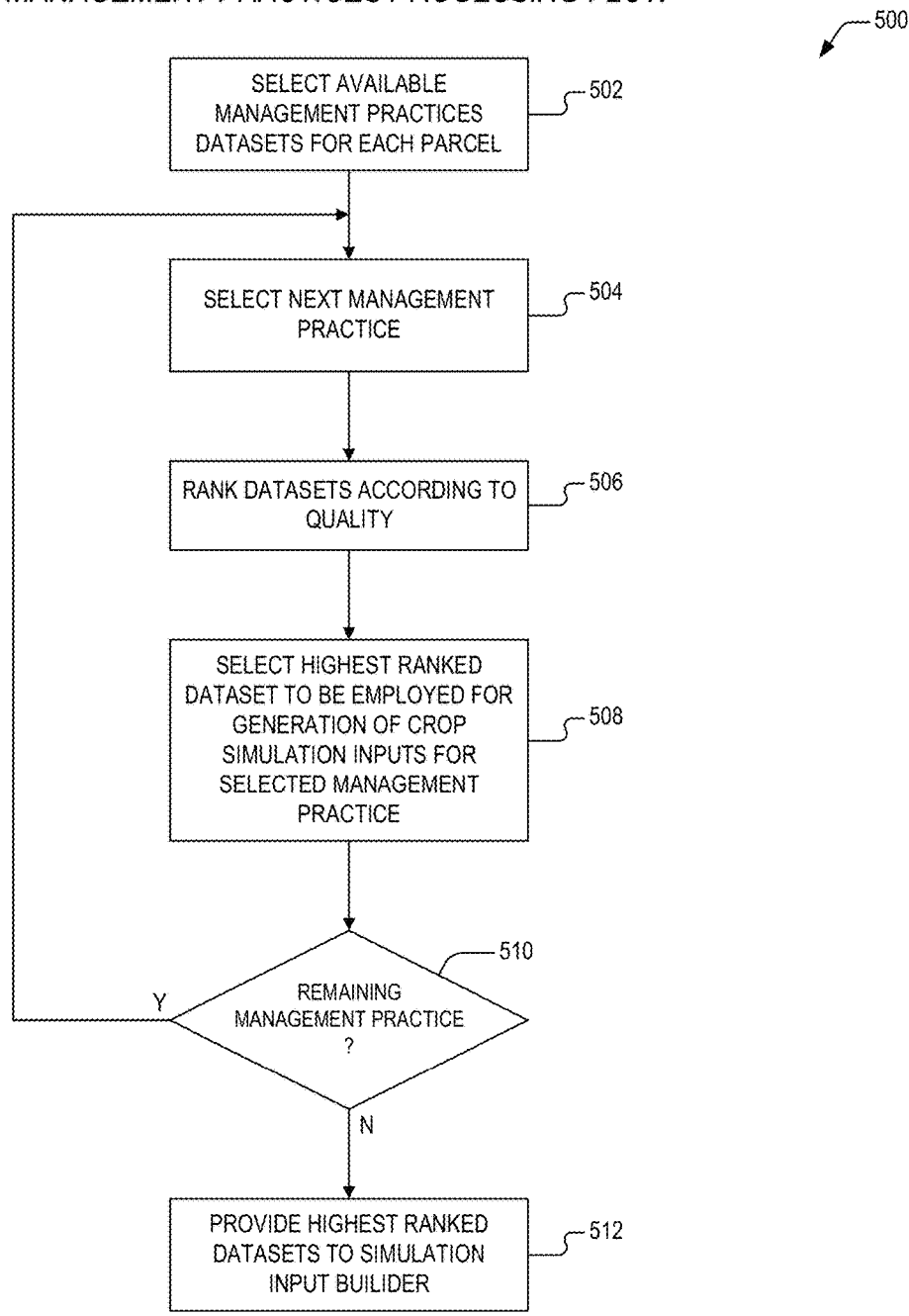
FIG. 5 is a flow diagram illustrating processing and ranking of agricultural management practices for generation of inputs to a crop simulation processor according to the present invention.

Now referring to FIG. 5, a flow diagram 500 is presented illustrating processing and ranking of agricultural management practices for generation of inputs to a crop simulation processor according to the present invention. As alluded to above, the management practices processor 155 may access the outputs of the remote sense processor 156 to evaluate and rank the outputs against other management practice data that is received from one or more of the databases 121-124. In turn, the management practices processor 155 may augment sparse or incomplete data in order to provide location-specific inferences for key crop management practices including, but not limited to planted crop type, specific cultivar or crop variety, planting data, planting density (i.e., row spacing), dates and amounts of fertilizer application, and irrigation practices. Flow begins at block 502 where all available management practices datasets are selected for each of the parcels. As one skilled in the art will appreciate, management practice data and corresponding datasets are highly dependent on location and type of management practice. For some practices and locations, a trusted dataset may be available, but which is incomplete along with a less-trusted, but complete dataset. In addition, available datasets may be more or less geographically granular ranging from state averages, to county averages, all the way down to data based on 30-meter grid. Finally, some management practices also may rely on a heuristic devised by agronomists. For example, a common rule of thumb for determining how much fertilizer a farmer would typically use is based on the expected amount of yield for a given crop. Flow then proceeds to block 504.

At block 504, a next management practice is selected and flow proceeds to block 506.

At block 506, all of the available datasets for the selected management practice are evaluated and ranked according to quality. This ranking is performed by directives that rank the available datasets according to their ability to generate inputs to the crop simulation processor 153 that will produce outputs that are accurate when compared to field trials and scientific data. Flow then proceeds to block 508.

At block 508, for the selected management practice, the highest ranked management practice dataset is selected for generation of crop simulation inputs. Flow then proceeds to decision block 510.

At decision block 510, an evaluation is made to determine if there are any remaining management practices whose datasets have not been assessed, ranked, and selected for generation of crop simulation inputs. The present inventors note that the selected value for one management practice may affect the selection of another. For instance, if corn is selected as a crop, then the planting date must be a date which is suitable for planting corn at the given location. A different crop selection would result in a different planting date selection. Accordingly, the management practices processor 155 develops directives that take into account dependency ordering of different management practices. If there are remaining management practices, then flow proceeds to block 504. If not, then flow proceeds to block 512.

At block 512, the highest ranked management practices dataset corresponding to each management practice is provided to a simulation input builder that generates inputs for the crop simulation processor 153.

Steps 502-512 are performed for each of the parcels. Accordingly, simulation inputs are generated for each of the parcels that employ the highest ranked management practices datasets.

Figure 6:
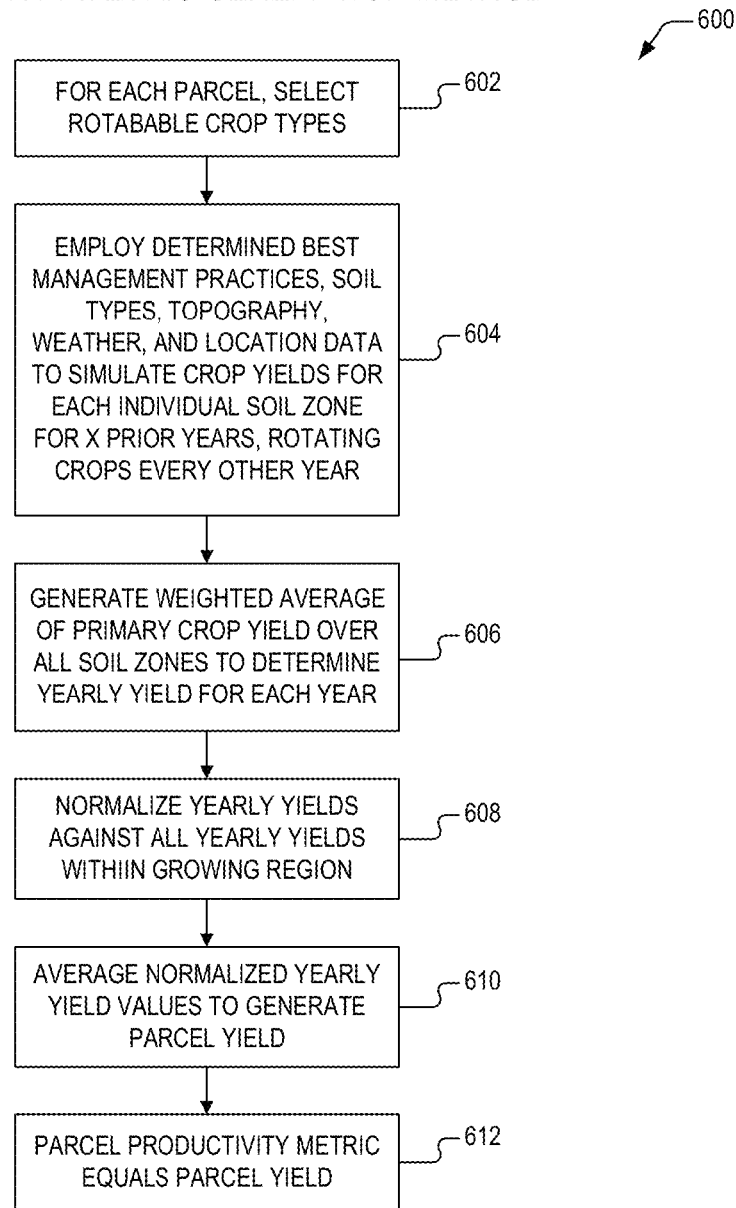
FIG. 6 is a flow diagram detailing a method for translation of crop simulation outputs into a productivity metric for an agricultural parcel that ranks the parcel relative to all other parcels within a specified growing region.

Now turning to FIG. 6, a flow diagram 600 is presented detailing a method for translation of crop simulation outputs into a productivity metric for an agricultural parcel that ranks the parcel relative to all other parcels within a specified growing region. The method will be described in terms of rotating crops (e.g., corn and soybeans, wheat and broadleaf crops, etc.) in order to clearly teach aspects of the present invention; however, the present inventors note that the method may also be modified to apply to crops that aren't rotated (e.g., light feeders), though such a practice is less common and not sustainable. Flow begins at block 602 where rotatable crop types are selected for each of the parcels using data derived by the remote sense processor 156. Flow then proceeds to block 604.

At block 604, simulation inputs provided by the management processor 155 along with soil types, topography, weather, and location data provided by the databases 121-124 are employed by the crop simulation processor 153 to simulate crop yields for individual soil zones within each of the parcels for a prescribed number of prior years, rotating crops every other year. This step is performed twice. First, a primary crop is simulated in even years and a secondary crop is simulated in odd years. Next, the secondary crop is simulated in even years and the primary crop is simulated in odd years. Thus, yields of the primary crop are simulated for each year (both odd and even years). The USDA SSURGO soil database is employed to divide up the tillable area of the parcels into soil zones. In one embodiment, the prescribed number of years is 10 years. Another embodiment contemplates 16 prior years. Flow then proceeds to block 606.

At block 606, the agricultural metrics processor 152 generates a weighted average of yields of the primary crop over all usable soil zones within each of the parcels to determine yearly primary crop yield for each of the prescribed number of years, where the weight for a given soil zone comprises the portion of the tillable soil zones occupied by the given soil zone. Next, an average primary crop yield for the prescribed number of years is determined for each of the parcels by dividing the sum of the yearly primary crop yields by the prescribed number of years. Thus, the metrics processor 152 generates an average primary crop yield for each of the parcels. Flow then proceeds to block 608.

At block 608, the average yearly primary crop yield for each of the parcels is normalized against all other average yearly primary crop yields within a prescribed region. In one embodiment, the region comprises state level. Another embodiment comprises a growing region (e.g., corn belt, wheat belt). Normalization generates a first number that is less than one for each parcel. The first number is a parcel's average yearly primary crop yield divided by a prescribed maximum yearly yield that represents the greatest average primary crop yield in the prescribed region. In one embodiment, the prescribed maximum yearly yield is slightly higher than the highest average primary crop yield for all of the parcels in the prescribed region. Next the first number is multiplied by 100 to generate a parcel yield number for each of the parcels that is between 0 and 100. Flow then proceeds to block 612.

At block 612, the metrics processor 152 generates a productivity metric (or, "score") for each parcel that is equal to its parcel yield number. Accordingly, a given parcel having a productivity score of, say, 90 indicates that the given parcel has had primary crop yields over the past X years that are higher is 90 percent of the prescribed maximum yearly yield. A productivity score of 90 additionally indicates that the given parcels has 50% higher yields than a parcel having a productivity score of 60.

Advantageously, the productivity metric generation method according to the present invention translates commercial and public data, remotely sensed data, topography data, farm management practices, field trials data, and crop simulation data into an agriculturally meaningful metric that expresses a parcel's historical productivity relative to all other parcels within a prescribed region so that a user predominately interested in productivity can make decisions more accurately than has heretofore been provided for by present-day techniques.

Figure 7:
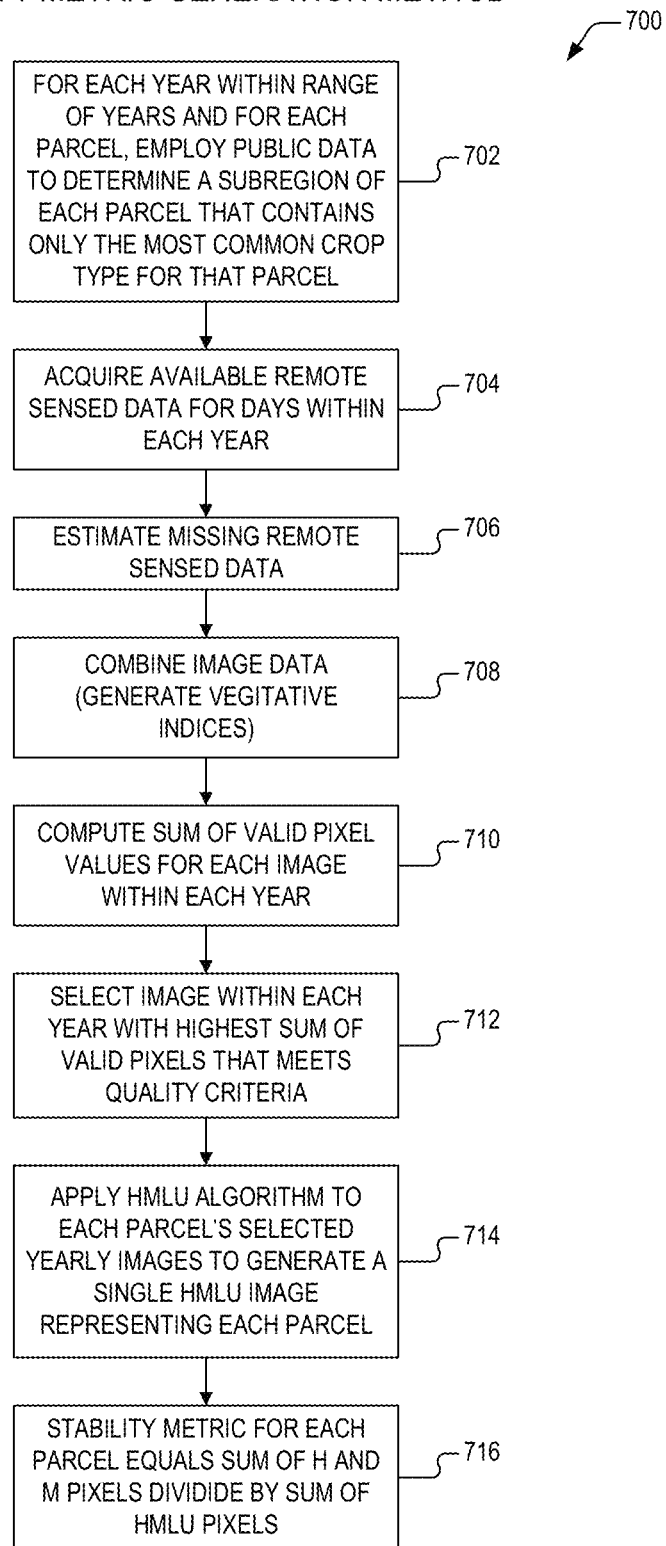
FIG. 7 is a flow diagram detailing a method for translation of remote sensed data into a stability metric for an agricultural parcel according to the present invention.

Referring now to FIG. 7, a flow diagram 700 is presented detailing a method for translation of remote sensed data into a stability metric for an agricultural parcel according to the present invention. Herein, the stability metric may be referred to as a stability score as well as a field reliability score. As noted above, a parcel's stability score characterizes the risk associated with production of a primary crop over a range of years. In order to clearly teach aspects of the present invention, the flow diagram 700 describes the process executed by the agricultural valuation server 130 to derive a stability score for a given parcel; however, the present inventors note that the valuation server 130 derives stability scores for all of the parcels within a prescribed region. Flow begins at block 702 where publicly available data is processed by the remote sense processor 156 to determine a subregion of the parcel that includes the most common crop type within that parcel. This determination is currently based on the publicly available CropScape and Cropland Data Layer database maintained by the USDA National Agricultural Statistics Service. The boundary determination is made for each year within a range of years. In one embodiment, the range comprises the previous 10 years. Another embodiment contemplates a range of 16 years. Flow then proceeds to block 704.

At block 704, available daily (or less frequent) image data for parcels within the prescribed region is acquired. As noted above, the image data may be from the public database 122 or the commercial database 123, and the images are downloaded, assessed and cleansed, and stored. Flow then proceeds to block 706.

At block 706, images that have missing data (e.g., covered by clouds) below a prescribed quality threshold are deleted. Images with missing data above the quality threshold are retained and some of the missing data may be estimated by time-processing data from other time-adjacent images which include those pixels. Flow then proceeds to block 708.

At block 708, relevant spectral bands for a given observation are combined to generate vegetative indices for subparts of the parcels as is described above with reference to FIG. 4. In one embodiment, red, green, blue, and near-infrared spectral bands are combined. Flow then proceeds to block 710.

At block 710, stability zones within each of the parcels are determined by the remote sense processor 156 by identifying a best vegetative index image for each of the parcels for each of a number of prescribed years. In one embodiment, one of the images within a given year is selected as the best vegetative index image by summing all of the intensities for each valid pixel within the vegetative index image and selecting the image that has the highest valid pixel sum. Valid pixels are those that 1) have an actual intensity value and 2) are not covered by clouds. As one skilled in the art will appreciate, some pixels within an image will have a "no data" value due to a number of possible reasons, such as malfunctions of the imaging system itself. At block 710, the sum for of the intensities in each of the images is computed. Flow then proceeds to block 712.

At block 712, a best vegetative index image is selected for each of the parcels for each year within the prescribed number of years. In one embodiment, the best vegetative index image comprises the image that has the highest valid pixel sum. Flow then proceeds to block 714.

At block 714, all of the yearly best vegetative index images for each parcel are processed as is discussed above with reference to FIG. 4 according to a stability zone algorithm to generate a single composite image where each valid pixel in the image represents one of a plurality of stability classes. In an embodiment that contemplates four stability classes, valid pixels are assigned as being high-stable, medium-stable, low-stable, and unstable. Going forward, to clearly teach the present invention, this embodiment will be discussed; however, the present inventors note that different numbers of stability classes (e.g., 2 stability classes, 3 stability classes, etc.) are contemplated. The stability zone algorithm is referred to also as HMLU algorithm. In operation the HMLU algorithm assigns to each pixel of the single composite image for a given parcel into one of five labels: high-stable (H), medium-stable (M), low-stable (L), unstable (U), and no-data. The algorithm has three prescribed parameters: a a low threshold, a high threshold, and an unstable threshold. The algorithm processes the single composite image as follows:

"No-data" is assigned if that pixel is missing in any of the images across all years; otherwise the pixel is considered valid If the pixel is valid:
  "U" is assigned if the standard deviation of that pixel across all years is higher than the unstable threshold, otherwise the pixel is considered stable
  if the pixel is stable:
    "H" is assigned if the mean of that pixel across all years is above the high threshold
    "L" is assigned if the mean of that pixel across all years is below the low threshold
    "M" is assigned if the mean of that pixel across all years is between the low and high thresholds Flow then proceeds to block 716.

At block 716, the metrics processor 152 computes a unique parcel stability metric by summing the pixels in the parcel's single composite image that are high-stability (H) or medium-stability (M) and dividing this sum by the sum of all pixels in the single composite images that are deemed valid by the HMLU algorithm, which yields a number between 0 and 1. This number is then multiplied by 100 to produce a stability score for each of the parcels that ranges from 0 to 100. Thus, a parcel with a low stability score is seen as a higher production risk relative to another parcel with a high stability score. As one skilled in the art will appreciate, though a stability score is computed for a given parcel using data that only corresponds to the given parcel, such a stability score is indeed correlated with land value, thus providing a means whereby the stability of the given parcel may be compared to other parcels within the prescribed region.

Advantageously, the stability metric generation method according to the present invention translates commercial and public data along with remotely sensed data into an agriculturally meaningful metric that expresses a parcel's historical productivity risk relative to all other parcels within a prescribed region so that a user predominately interested in productivity risk can make decisions more accurately than has heretofore been provided for by present-day techniques.

Figure 8:
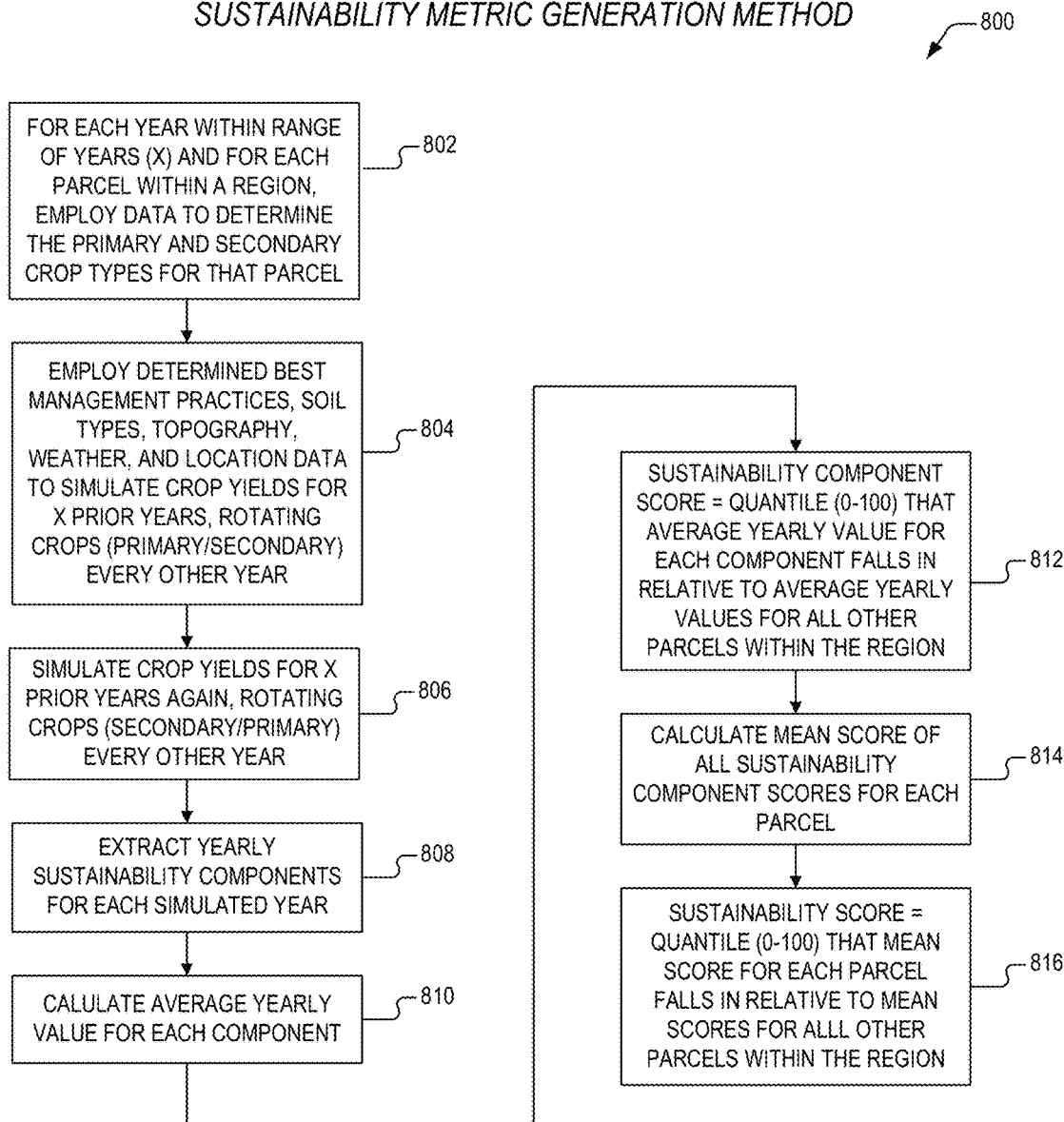
FIG. 8 is a flow diagram detailing a method for translation of crop simulation outputs into a sustainability metric for an agricultural parcel that ranks the parcel relative to all other parcels within a specified growing region.

Now turning to FIG. 8, a flow diagram 800 is presented detailing a method for translation of crop simulation outputs into a sustainability metric for an agricultural parcel that ranks a given parcel relative to all other parcels within a specified growing region. As one skilled in the art will appreciate, farming the landscape requires time, energy, and inputs such as nitrogen fertilizer. Complex interactions between the land, the weather, and the way a crop is managed determine the required inputs to maximize crop yield and the impact those inputs have on the environment. Understanding the overall sustainability of a farm requires a deep understanding of the land itself, as well as how it has been managed over time. Recognizing that some parcels require greater inputs to maintain yields than are required by other parcels, the method for translation of crop simulation outputs into a sustainability metric employs the crop simulation processor 153 to model the day to day growth of a crop on a particular parcel, together with the nutrients required to sustain it as provided by the management practices processor 155. Like the method for translating modeled yield into a productivity metric as described above, the method for generating the sustainability metric models not only the yield for a parcel, but also the amount of nitrogen leached into groundwater and the quantity of greenhouse gasses emitted in the production process. These components are generated by the crop simulation processor 153 and are generated uniquely for each parcel, taking into account local soil and weather conditions along with best management practices as provided by the management processor 155.

In one embodiment, a sustainability metric (or, "score") for a parcel comprises a number of component scores, each corresponding to a specific measure of sustainability. In one embodiment, the component scores comprise a nitrogen leaching score and a greenhouse gas emissions score. Other embodiments contemplate additional component scores such as, but not limited to, irrigation use scores, energy use scores, soil erosion scores, soil carbon exchange scores, biodiversity scores, and water quality scores. As will be described in further detail below, component scores range from 0 to 100 and indicate a quantile into which that component value falls over a prescribed region (e.g., state, county, growing region). For example, if a parcel's nitrogen leaching score is 75, it means that the amount of nitrogen leached out of that parcel as modeled by the crop simulation processor 153 is better than three-quarters of the parcels in the prescribed region.

In one embodiment, the nitrogen leaching score generated by the crop simulation processor 153 expresses the annual amount of nitrogen that leaves a parcel and enters groundwater. The greenhouse gas emissions score expresses the annual amount of greenhouse gases that are released from a parcel, where the annual amount of greenhouse gases released comprises the sum of four subcomponents: carbon dioxide flux from the soil, nitrous oxide flux from the soil, carbon dioxide from tractor fuel use, and carbon dioxide from production of nitrogen fertilizer. It is beyond the scope of the present application to provide an in-depth discussion of how these component scores are calculated; however, it is sufficient to note that these component scores are calculated according to Intergovernmental Panel on Climate Change (IPCC) Tier 1 methods, and are processed by the metrics processor 152 as is described below to provide an overall sustainability metric that expresses how a given parcel is sustainable relative to all other parcels within the prescribed region.

The method of FIG. 8 will now be described in terms of rotating crops (e.g., corn and soybeans, wheat and broadleaf crops, etc.) in order to clearly teach aspects of the present invention; however, the present inventors note that the method may also be modified to apply to crops that aren't rotated (e.g., light feeders), though such a practice is less common and not sustainable. Flow begins at block 802 where rotatable crop types are selected for each of the parcels over a prescribed number of years using data derived by the remote sense processor 156. In one embodiment, the prescribed number of years comprises 16 years, though other year ranges are contemplated. Flow then proceeds to block 804.

At block 804, simulation inputs provided by the management processor 155 along with soil types, topography, weather, and location data provided by the databases 121-124 are employed by the crop simulation processor 153 to simulate crop yields for individual soil zones within each of the parcels for the prescribed number of prior years, rotating crops every other year. This step is performed twice. First, at block 804, a primary crop is simulated in even years and a secondary crop is simulated in odd years. Next, at block 806, the secondary crop is simulated in even years and the primary crop is simulated in odd years. Thus, yields and sustainability components of the primary crop are simulated and generated for each year (both odd and even years). Flow then proceeds to block 808.

At block 808, yearly sustainability components as described above as provided by the crop simulation processor 153 are extracted by the agricultural metrics processor 152. Flow then proceeds to block 810.

At block 810, the metrics processor 152 calculates an average yearly component value for each of the sustainability components provided by the simulation processor 153. Flow then proceeds to block 812.

At block 812, the metrics processor 152 processes the average yearly component values for all of the parcels by assigning the average yearly component values to quantiles ranging from 0 to 100 relative to all of the parcels within the prescribed region, thus yielding a quantile score for each sustainability component for each of the parcels. Flow then proceeds to block 814.

At block 814, the metrics processor 152 calculates a mean of the component quantile scores for each of the parcels, thus yielding an average parcel sustainability component score. Flow then proceeds to block 816.

At block 816, the average parcel sustainability component scores are assigned to quantiles ranging from 0 to 100 relative to all of the parcels within the prescribed region. The quantile into which a given average parcel sustainability component score falls is the parcel's sustainability score.

Advantageously, the sustainability metric generation method according to the present invention translates commercial and public data, remotely sensed data, topography data, farm management practices, field trials data, and crop simulation data into an agriculturally meaningful metric that expresses a parcel's sustainability attribute relative to all other parcels within a prescribed region so that a user predominately interested in sustainable farming (e.g., reducing carbon dioxide emissions, organic farming methods, etc.) can make decisions more accurately than has heretofore been provided for by present-day techniques.

Figure 9:
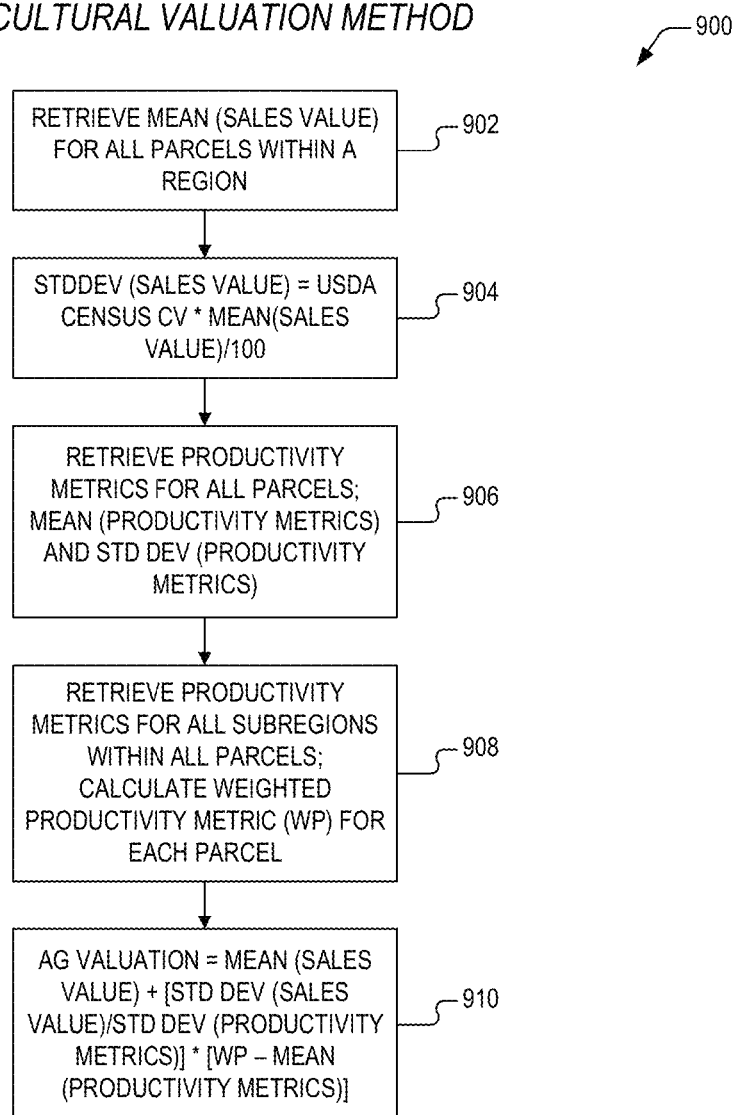
FIG. 9 is a flow diagram detailing a method for translation of agricultural metrics and comparable sales prices into a valuation for an agricultural parcel relative to all other parcels within a specified growing region.

Referring now to FIG. 9, a flow diagram 900 is presented detailing a method for translation of agricultural metrics and comparable sales prices into an agriculturally meaningful valuation for an agricultural parcel relative to all other parcels within a specified growing region. As noted above, the valuation assigned to a parcel employs one or more of the agricultural metrics (e.g., productivity scores, stability scores, and sustainability scores) as a function of a user's role as supplemented by comparable sales to express an agricultural value in dollars per acre as opposed to just a value that is based on comparable parcels. Advantageously, the user is exposed to a valuation of a parcel based upon the parcel's agricultural potential, which is a substantial improvement over that which has heretofore been provided.

In one embodiment, as will be described in further detail below, the productivity score for a given parcel is employed in conjunction with productivity scores for surrounding parcels along with USDA census and sales data to generate the agricultural valuation. Other embodiments contemplate employment of other and/or additional agricultural metrics to arrive at an agricultural valuation that is meaningful to a given user's role (e.g., farmer, enterprise farm, banking, underwriting). Further embodiments envision the employment of weighted agricultural metrics to generate an agricultural valuation that is meaningful to a given user's role.

Flow begins at bock 902, where the agricultural valuation server 130 retrieves the mean sales value for all parcels within a prescribed region, where the prescribed region may comprise county, state, or growing region. The mean sales value, MEAN SALES VALUE is retrieved from the public database 122, and more specifically the USDA Census of Agriculture provided by the National Agricultural Statistics Service. Flow then proceeds to block 904.

At block 904, the valuation processor 154 calculates a standard deviation of the mean sales value, STDEV(MEAN SALES VALUE) by dividing MEAN SALES VALUE by 100 and multiplying the result by the USDA Coefficient of Variation for the prescribed region. Flow then proceeds to block 906.

At block 906, the valuation processor 154 retrieves the productivity metrics for all parcels within the prescribed region from the parcel database 151. Next the valuation processor 154 calculates a mean of all the productivity scores within the region, MEAN(PRODUCTIVITY SCORES) along with a standard deviation of the productivity scores STDDEV(PRODUCTIVITY SCORES). Flow then proceeds to block 908.

At block 908, the valuation processor 154 calculates a weighted productivity metric WP for each parcel in the prescribed region, where WP represents a weighted average productivity score for all tillable acres within the parcel. Recall that different soil zones as defined by the USDA SSURGO soil database exhibit differing productivity scores, reflecting each particular soil zone's ability to produce. WP for a given soil zone, WP(ZONE) is calculated by multiplying each soil zone's productivity by the acreage of that soil zone. Next, WP for the parcel is calculated by summing all WP(ZONE) values for all zones in the parcel and dividing by the total tillable acreage of the parcel. Flow then proceeds to block 910.

At block 910 an objective valuation AG VALUATION for each parcel is calculated as follows:

AG VALUATION=MEAN SALES VALUE+[STD-DEV(SALES VALUE)/STDDEV(PRODUC-TIVITY SCORES)]*[WP−MEAN(PRODUC-TIVITY SCORES)].

In one embodiment, the productivity scores, stability scores, and sustainability scores for parcels are employed as supplemented by commercial sales prices to translate these metrics into agricultural valuations that may be more useful to a particular type of user, where weights are assigned to each of the scores in accordance with the level of insight that a that is required by the particular type of user. For example, a single farmer may be focused solely on productivity of a parcel and would hence employ AG VALUATION as discussed with reference to block 910. Alternatively, a lender may be equally interested equally in production and production risk (i.e., stability) and would be influenced by an agricultural valuation that equally weights both productivity scores and stability scores for parcels. An enterprise farming corporation may be focused exclusively on carbon offsets and may be influenced by an agricultural valuation that weights sustainability over production. Accordingly, the present invention contemplates the above embodiments as provided for by the valuation method described above.

Advantageously, the agricultural valuation provided for by the present invention is configurable to generate a values for parcels that considers what is most important to a particular user, which is a significant improvement over present-day valuation methods that exclusively consider commercial sales prices.

Turning now to FIG. 10, a block diagram is presented illustrating an agricultural valuation server 1000 according to the present invention, such as the valuation server 130 of FIG. 1. The valuation server 1000 may include one or more central processing units (CPU) 1001 that are coupled to memory 1006 having both transitory and non-transitory memory components therein. The CPU 1001 is also coupled to a communications circuit 1002 that couples the valuation server 1000 to the internet cloud 110 via one or more wired and/or wireless links 1003. The links 1003 may include, but are not limited to, Ethernet, cable, fiber optic, and digital subscriber line (DSL). As part of the network path to and through the cloud 110, providers of internet connectivity (e.g., ISPs) may employ wireless technologies from point to point as well.

The valuation server 1000 may also comprise input/output circuits 1004 that include, but are not limited to, data entry and display devices (e.g., keyboards, monitors, touchpads, etc.). The memory 1006 may be coupled to a parcel database 1005 and to the databases 121-124 described with reference to FIG. 1 above. Though the valuation server 1000 is shown directly coupled to databases 121-124 and 1005, the present inventors note that interfaces to these data sources may exclusively be through the communications circuit 1002 or may be through a combination of direct interface and through the communications circuit 1002, according to the source of data.

The memory 1006 may include an operating system 1007 such as, but not limited to, Microsoft Windows, Mac OS, Unix, and Linux, where the operating system 1007 is configured to manage execution by the CPU 1001 of program instructions that are components of one or more application programs. In one embodiment, a single application program comprises a plurality of code segments 1008-1016 resident in the memory 206 and which are identified as a configuration code segment CONFIG 1008, a client communications code segment CLIENT COMM 1009, a presentation processor code segment PRESENTATION PROC 1010, a web services code segment WEB SERV 1011, an agricultural metrics processor code segment AG METRICS PROC 1012, a crop simulation processor code segment CROP SIM PROC 1013, a valuation processor code segment VALUATION PROC 1014, a management practices processor code segment MGMT PROC 1015, and a remote sense processor code segment REM SENSE PROC 1016.

Operationally, the valuation server 1000 may execute one or more of the code segments 1008-1016 under control of the OS 1007 as required to enable the valuation server 1000 to ingest new data from external data sources 121-124, to employ data from the sources 121-124 in crop simulations that translate the data into meaningful agricultural metrics and corresponding valuations for approximately 20 million agricultural parcels, and to store these metrics and valuations in the parcel database 1005 in a manner that can be rapidly and easily searched and accessed by users that communicate with the valuation server 1000 over the communications circuit 1002 via client applications 104-106 executing on their respective client devices 101-103. The valuation server 1000 may further be configured to execute one or more of the code segments 1008-1016 under control of the OS 1007 as required to enable the valuation server 1000 to format and present search results and corresponding parcel data to the client applications 104-106 executing on their respective client devices 101-103 and to receive communications therefrom that users specify to narrow search results, to perform new searches altogether, and to specify the relative importance of one or more agricultural metrics relative to other agricultural metrics in order to calculate agricultural valuations of parcels according to relative importance of the agricultural metrics relative to other agricultural metrics.

CONFIG 1008 may be executed to place the server 1000 into an operational or maintenance mode, where the maintenance mode may be entered to allow for ingestion of new data from the data sources 121-124 via automated or manual means. CLIENT COMM 1009 may be executed to perfect reliable transfer of information between the valuation server 1000 and client applications 104-106 executing on respective client devices 101-103. PRESENTATION PROC 1010 may be executed to perform searches of the parcel database 1005, to provide search results, and to interact with client applications 104-106 executing on respective client devices 101-103 as is described above with reference to FIGS. 1-3. WEB SERV 1011 may be executed to provide for formatting of information provided by PRESENTATION PROC 1010 for transmission to the client applications 104-106 and for formatting of information that is provided to PRESENTATION PROC 1010 which has been received from the client applications 104-106.

AG METRICS PROC 1012 may be executed to perform any of the functions and operations described above with reference to the agricultural metrics processor 152 of FIG. 1. CROP SIM PROC 1013 may be executed to perform any of the functions and operations described above with reference to the crop simulation processor 153 of FIG. 1. VALUATION PROC 1014 may be executed to perform any of the functions and operations described above with reference to the agricultural valuation processor 154 of FIG. 1. MGMT PROC 1015 may be executed to perform any of the functions and operations described above with reference to the management practices processor 155 of FIG. 1. And REM SENSE PROC 1016 may be executed to perform any of the functions and operations described above with reference to the remote sense processor 156 of FIG. 1.

Figure 11:
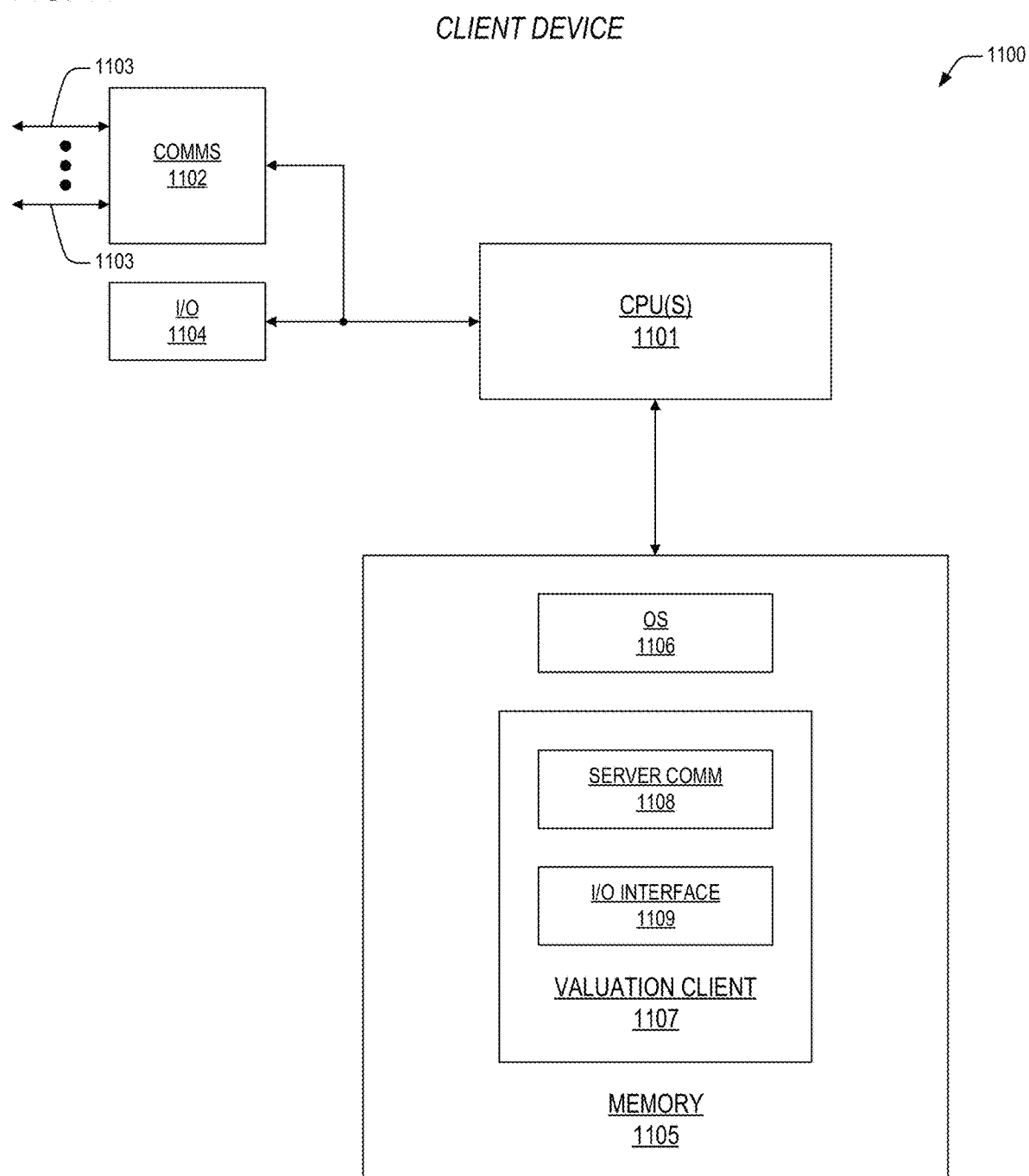
FIG. 11 is a block diagram depicting a client device according to the present invention.

Now referring to FIG. 11, a block diagram is presented depicting a client device 1100 according to the present invention, such as the client devices 101-103 discussed above with reference to FIG. 1. The client device 1100 may include one or more central processing units (CPU) 1101 that are coupled to memory 1105 having both transitory and non-transitory memory components therein. The CPU 1101 is also coupled to a communications circuit 1102 that couples the client device 1100 to internet cloud 110 via one or more wired and/or wireless links 1103. The links 1103 may include, but are not limited to, Ethernet, cable, fiber optic, and digital subscriber line (DSL).

The client device 1100 may also comprise input/output circuits 1104 that include, but are not limited to, data entry and display devices (e.g., keyboards, monitors, touchpads, etc.).

The memory 1005 may include an operating system 1106 such as, but not limited to, Microsoft Windows, Mac OS, Unix, Linux, iOS, and Android OS, where the operating system 1106 is configured to manage execution by the CPU 1101 of program instructions that are components of a valuation client application program 1107. In one embodiment, the valuation client application program 1107 comprises a server communications code segment SERVER COMM 1108 and an I/O interface code segment I/O INTERFACE 1109.

When executing on the client device 1100, the valuation client 1107 provides for display of information provided by the valuation server 130, 1000 on the input/output circuits 1104 that help a user make decisions regarding which parameters to specify in order to perform searches of the parcel database 151, 1005. The SERVER COMM 1108 segment may execute to receive this information and the I/O INTERFACE segment 1109 may execute to transmit this information to the input/output circuit 1104. Likewise, the valuation client 1107 provides for input of search parameters provided by the user via the input/output circuit for transmission to the valuation server 130, 1000 that direct the valuation server 130, 1000 to refine an ongoing search in order to narrow down a number of parcels that satisfy the search parameters, to specify parameters that direct the valuation server 130, 1000 to perform new searches altogether, and to specify the relative importance of one or more agricultural metrics relative to other agricultural metrics that direct valuation server 130, 1000 to calculate agricultural valuations of parcels according to the relative importance of the agricultural metrics relative to other agricultural metrics. The SERVER COMM 1108 segment may execute to transmit this information and the I/O INTERFACE segment 1109 may execute to receive this information to the input/output circuit 1104.

The functions and operations described above with reference to the valuation server 130, 1000 according to the present invention result in a significant improvement in this field of technology by providing a superior technique for translating massive amounts of agricultural data for millions of parcels into agriculturally meaningful metrics and corresponding agricultural valuations and that aggregate the metrics and valuation along with public and commercial sales data for these parcels into detailed parcel reports that are displayed on client devices 101-103, 1100. In one embodiment, data corresponding to the detailed parcel reports are stored in the parcel database 151 for all agricultural parcel in the United States, approximately 20 million parcels. The parcel report is the culmination all of the functions and operations described above and includes a combination of data from public datasets, commercial datasets, management practices inference, remote sensing inference, crop simulation results, and final metric and agricultural algorithmic results. In one embodiment, to enable a search interface for users, the valuation server 130, 1000 indexes key pieces of the data within the parcel database 151 into a full-text search engine. This allows users to filter through millions of parcels to retrieve those which fit their particular search criteria with sub-second search response time. Exemplary client device displays will now be presented with reference to FIGS. 12-18 that show how exemplary data is presented to a user, how exemplary search parameters are input by the user for transmission to the valuation server 130, 1000, and how information is displayed to the user via exemplary detailed parcel reports.

Figure 12:
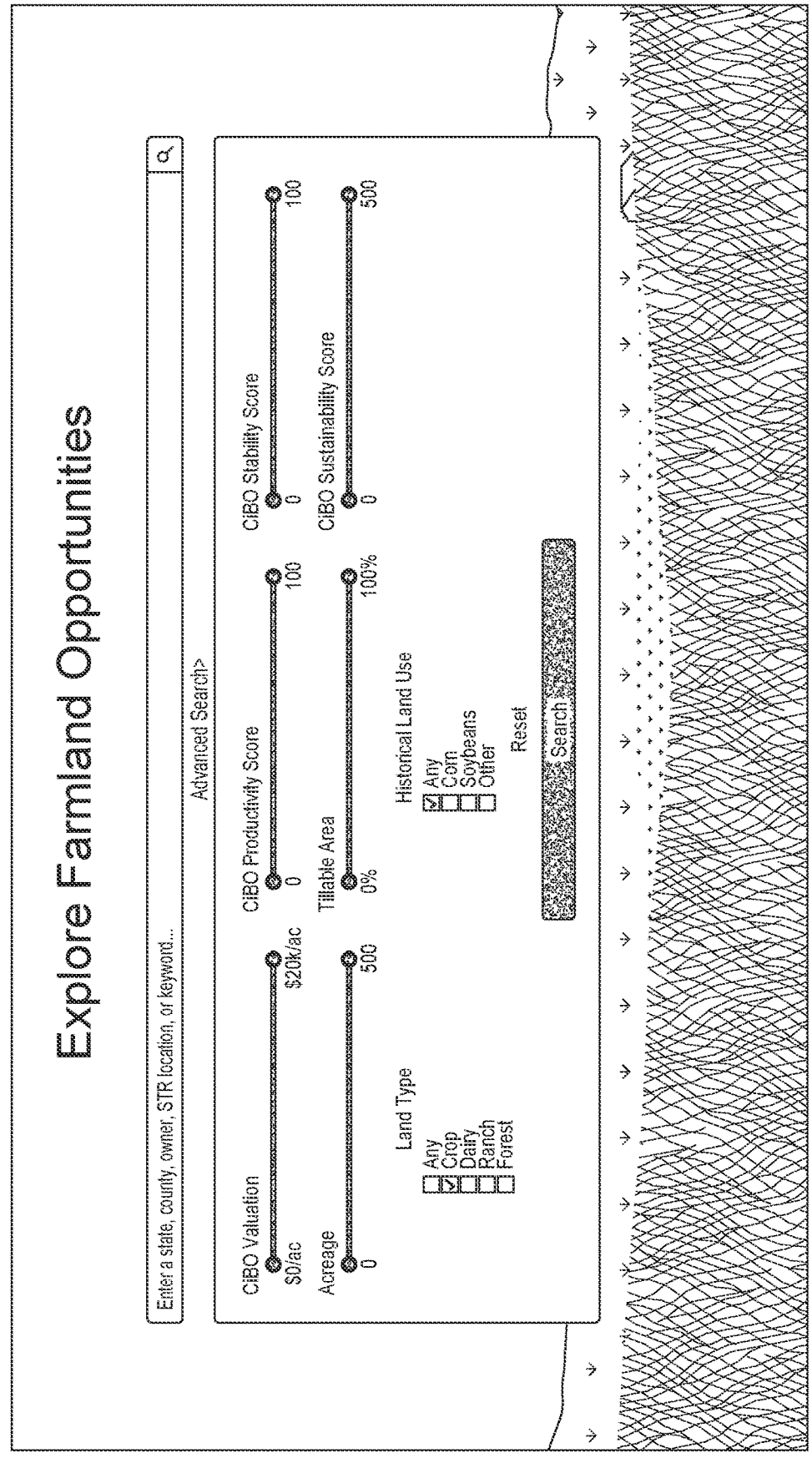
FIG. 12 is a diagram featuring an exemplary advanced search display according to the present invention such as might be presented by the client device of FIG. 11.

Now turning to FIG. 12, a diagram is presented featuring an exemplary advanced search display 1200 according to the present invention, such as might be presented by the client device 1100 of FIG. 11. The display includes an entry field, wherein a user may enter growing region, state, county, zip code, Public Land Survey System (PLSS), keywords, parcel owner name, historical land use (e.g., crop type), land type (e.g., farm, dairy, ranch, forest, etc.), parcel acreage, tillable area, and agricultural metrics and agricultural valuations generated by the valuation server 130. In the exemplary embodiment shown, sliders are presented to adjust both a lower and upper bound for the valuation, productivity score, stability score, total acreage, tillable acreage, and sustainability score. Check boxes are provided for selection of land type and crop type (i.e., historical land user.

Figure 13:
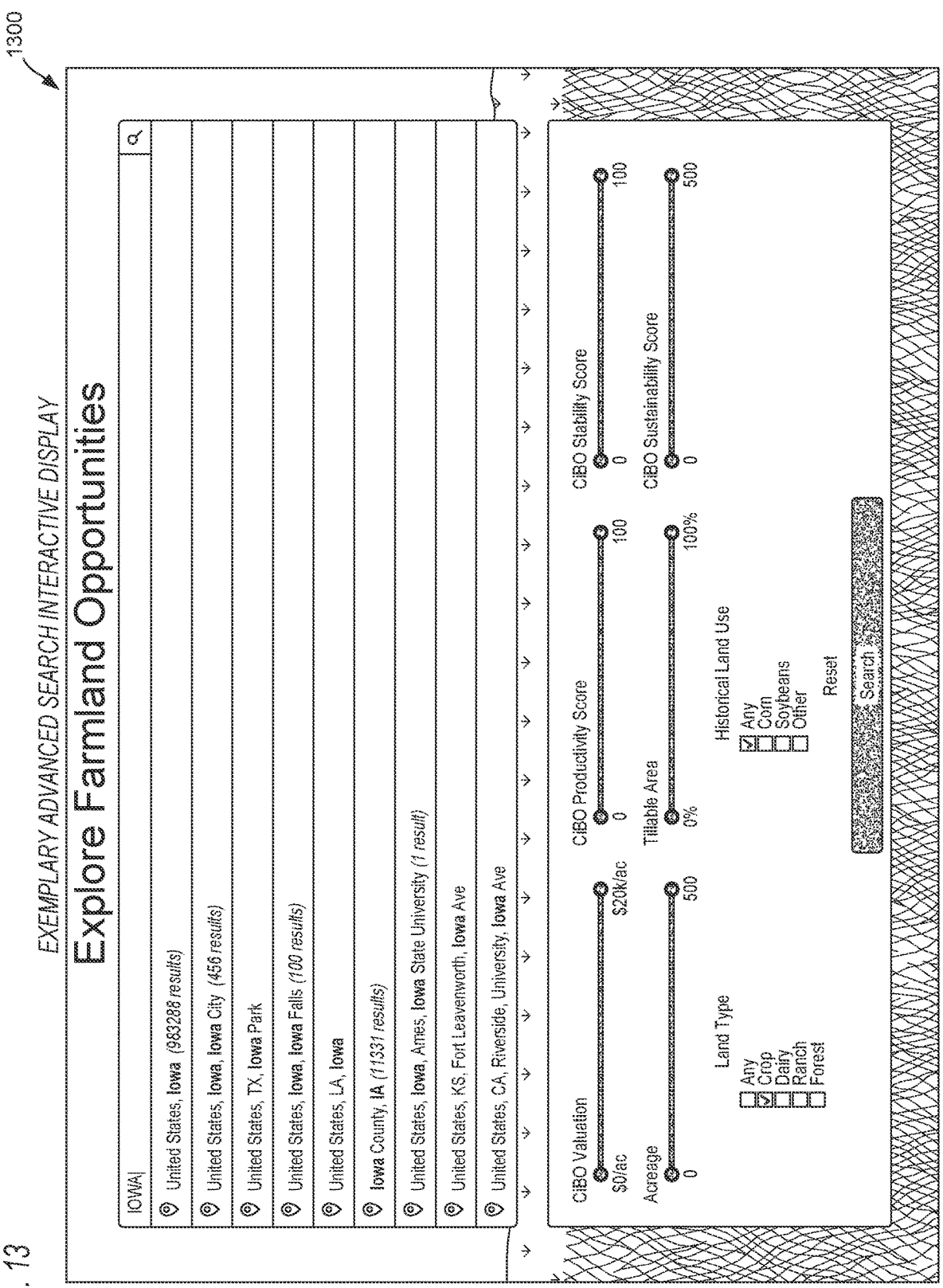
FIG. 13 is a diagram showing an exemplary advanced search interactive display according to the present invention such as might be presented by the client device of FIG. 11.

FIG. 13 is a diagram showing an exemplary advanced search interactive display 1300 according to the present invention, such as might be presented by the client device of FIG. 11. This display 1300 shows additional display items transmitted by the server 130 when a user has entered "IOWA" in the search field, that further assist the user in specifying the remainder of the search field. Items include Iowa City, Iowa; Iowa Park, Tex.; Iowa, La.; etc.

FIG. 14 is a diagram illustrating an exemplary advanced search results display 1400 according to the present invention such as might be presented by the client device of FIG. 11. Once a user has specified search parameters via interactions with the displays 1200-1300 of FIGS. 12 and 13, the server 130 then transmits a list of parcels to the client device 1100 that satisfy the search parameters. In the results display 1400 shown, the results are displayed on a drillable map as small dots, and which are further listed on the right side of the display, whereby the user may scroll and select a detailed parcel report.

FIG. 15 is a diagram detailing an exemplary parcel report with valuation details display 1500 according to the present invention, such as might be presented by the client device of FIG. 11. In this display 1500, the user has selected a parcel identified as "S30 79N 6W, Johnson, Iowa." The display 1500 also shows helpful orientation information for the user such as total acres, tillable percentage of total acres, previous crop type, and owner name. The display 1500 further shows the agricultural valuation generated by the valuation processor 154 as discussed above along with the parcel's productivity, field reliability (i.e., stability), and sustainability scores that are generated by the agricultural metrics processor 152. In addition, a historical yield of primary and secondary crops is shown. This display 1500 also features details of the agricultural valuation generated by the valuation processor 154 as a parcel valuation, valuation per acre, and valuation per tillable acre. In addition to contributing details (e.g., property taxes and assessment), the display 1500 shows a graphic of the parcel's valuation relative to all other parcels in a prescribed region, namely within the county.

FIG. 16 is a diagram detailing an exemplary parcel report with productivity metric details display 1600 according to the present invention, such as might be presented by the client device of FIG. 11. This display 1600 is substantially similar to the display 1500 of FIG. 15, except that the user has highlighted the productivity score to display a graphic of the parcel's productivity score relative to all other parcels in the prescribed region, namely within the county.

Figure 17:
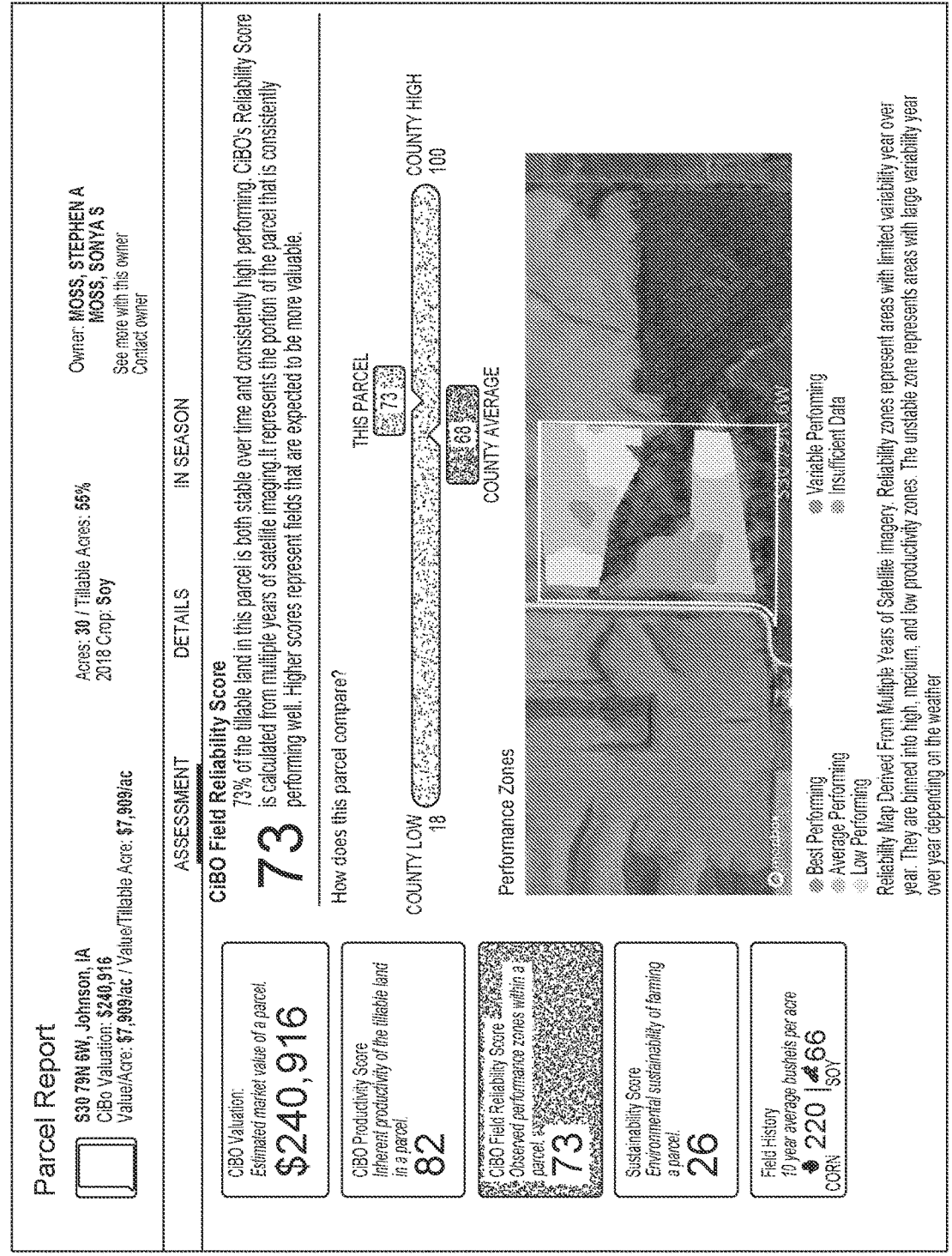
FIG. 17 is a diagram detailing an exemplary parcel report with stability metric details display according to the present invention such as might be presented by the client device of FIG. 11.

FIG. 17 is a diagram detailing an exemplary parcel report with stability metric details display 1700 according to the present invention, such as might be presented by the client device of FIG. 11. This display 1700 is substantially similar to the display 1500 of FIG. 15, except that the user has highlighted the field reliability score to display a graphic of the parcel's stability score relative to all other parcels in the prescribed region, namely within the county. In addition to this graphic, a color-coded map of the parcel is shown that depicts the various stability zones for the parcel as determined by the agricultural metrics processor 154.

Figure 18:
FIG. 18 is a diagram detailing an exemplary parcel report with sustainability metric details display according to the present invention such as might be presented by the client device of FIG. 11.

Finally, FIG. 18 is a diagram detailing an exemplary parcel report with sustainability metric details display 1800 according to the present invention, such as might be presented by the client device of FIG. 11. This display 1800 is substantially similar to the display 1500 of FIG. 15, except that the user has highlighted the sustainability score to display a graphic of the parcel's sustainability score relative to all other parcels in the prescribed region, namely within the county. In addition to this graphic, details are displayed regarding the relative contribution of each of the sustainability components (e.g., nitrogen leaching score and greenhouse gas emissions score) that are employed to generate the overall sustainability score for the parcel.

Portions of the present invention and corresponding detailed description are presented in terms of software or algorithms, and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, a microprocessor, a central processing unit, or similar electronic computing device, that manipulates and transforms data represented as physical, electronic quantities within the computer system's registers and memories into other data similarly represented as physical quantities within the computer system memories or registers or other such information storage, transmission or display devices.

Note also that the software implemented aspects of the invention are typically encoded on some form of program storage medium or implemented over some type of transmission medium. The program storage medium may be electronic (e.g., read only memory, flash read only memory, electrically programmable read only memory), random access memory magnetic (e.g., a floppy disk or a hard drive) or optical (e.g., a compact disk read only memory, or "CD ROM"), and may be read only or random access. Similarly, the transmission medium may be metal traces, twisted wire pairs, coaxial cable, optical fiber, or some other suitable transmission medium known to the art. The invention is not limited by these aspects of any given implementation.

The particular embodiments disclosed above are illustrative only, and those skilled in the art will appreciate that they can readily use the disclosed conception and specific embodiments as a basis for designing or modifying other structures for carrying out the same purposes of the present invention, and that various changes, substitutions and alterations can be made herein without departing from the scope of the invention as set forth by the appended claims. For example, components/elements of the systems and/or apparatuses may be integrated or separated. In addition, the operation of the systems and apparatuses disclosed herein may be performed by more, fewer, or other components and the methods described may include more, fewer, or other steps. Additionally, unless otherwise specified steps may be performed in any suitable order.

Although specific advantages have been enumerated above, various embodiments may include some, none, or all of the enumerated advantages.

What is claimed is:

1. A method for agricultural land parcel valuation, the method comprising:

accessing data corresponding to each of a plurality of parcels within a prescribed region, the data comprising corresponding management practices, corresponding historical weather conditions, corresponding locations and topography, corresponding remote sense images, corresponding soil types, and corresponding crop types;

assessing and ranking the corresponding management practices for the each of the plurality of parcels;

generating simulation inputs for the each of the plurality of parcels, wherein the simulation inputs comprise highest ranked corresponding management practices, the corresponding historical weather conditions, the corresponding locations and topography, the corresponding soil types, and the corresponding crop types;

simulating crop growth for the each of the plurality of parcels over a prescribed number of previous years, wherein said simulating employs the simulation inputs provided by said generating;

employing selected outputs from said simulating to calculate agricultural metrics and a valuation corresponding to the each of the plurality of parcels, wherein the valuation for the each of the plurality of parcels is expressed relative to all of the plurality of parcels within the prescribed region, the agricultural metrics comprising a sustainability metric and a stability metric, and wherein the sustainability metric comprises a function of an average of yearly sustainability component values, and wherein said yearly sustainability component values comprise yearly nitrogen leaching scores and yearly greenhouse gas emissions scores, and wherein said yearly nitrogen leaching scores and said yearly greenhouse gas emissions scores are calculated based upon outputs of said simulating crop growth for a corresponding year, and wherein a processor combines best yearly vegetative index images according to a stability (HMLU) algorithm into a single HMLU image and then calculates the stability metric comprising a fraction of the single HMLU image that comprises high-stability and medium-stability pixels;

storing the agricultural metrics and the valuation corresponding to the each of the plurality of parcels in corresponding database records; and via a communications circuit disposed within a server; receiving search inputs from a client device; and responsive to reception of the search inputs, transmitting one or more of the corresponding database records that satisfy the search inputs to the client deice.

2. The method as recited in claim 1, wherein the prescribed region comprises a county.

3. The method as recited in claim 1, wherein the prescribed number of previous years comprises 16 years.

4. The method as recited in claim 1, wherein the agricultural metrics for the each of the plurality of parcels further comprise a productivity metric and a stability metric.

5. The method as recited in claim 4, wherein the stability metric comprises a measure of the risk associated with producing crops on the each of the plurality of parcels over a range of years.

6. The method as recited in claim 5, wherein the wherein the productivity metric comprises a function of a weighted average of yearly primary crop yield simulation outputs, and wherein weights for the weighted average comprise fractions of tillable acreage for each of a plurality of soil type zones within the given parcel.

7. The method as recited in claim 6, wherein the valuation for the each of the plurality of parcels comprises a function of the productivity metric, corresponding productivity metrics for all of the plurality of parcels, and corresponding sales values for the all of the plurality of parcels.

8. A non-transitory computer-readable storage medium storing program instructions that, when executed by a computer, cause the computer to perform a method for agricultural land parcel valuation, the method comprising:

accessing data corresponding to each of a plurality of parcels within a prescribed region, the data comprising corresponding management practices, corresponding historical weather conditions, corresponding locations and topography, corresponding remote sense images, corresponding soil types, and corresponding crop types;

assessing and ranking the corresponding management practices for the each of the plurality of parcels;

generating simulation inputs for the each of the plurality of parcels, wherein the simulation inputs comprise highest ranked corresponding management practices, the corresponding historical weather conditions, the corresponding locations and topography, the corresponding soil types, and the corresponding crop types;

simulating crop growth for the each of the plurality of parcels over a prescribed number of previous years, wherein said simulating employs the simulation inputs provided by said generating;

employing selected outputs from said simulating to calculate agricultural metrics and a valuation corresponding to the each of the plurality of parcels, wherein the valuation for the each of the plurality of parcels is expressed relative to all of the plurality of parcels within the prescribed region, the agricultural metrics comprising a sustainability metric and a stability metric, and wherein the sustainability metric comprises a function of an average of yearly sustainability component values, and wherein the yearly sustainability component values comprise yearly nitrogen leaching scores and yearly greenhouse gas emissions scores, and wherein the yearly nitrogen leaching scores and the yearly greenhouse gas emissions scores are calculated based upon outputs of said simulating crop growth for a corresponding year, and wherein a processor combines best yearly vegetative index images according to a stability (HMLU) algorithm into a single HMLU image and then calculates the stability metric comprising a fraction of the single HMLU image that comprises high-stability and medium-stability pixels;

storing the agricultural metrics and the valuation corresponding to the each of the plurality of parcels in corresponding database records; and via a communications circuit disposed within a server; receiving search inputs from a client device; and responsive to reception of the search inputs, transmitting one or more of the corresponding database records that satisfy the search inputs to the client deice.

9. The non-transitory computer-readable storage medium as recited in claim 8, wherein the prescribed region comprises a county.

10. The non-transitory computer-readable storage medium as recited in claim 8, wherein the prescribed number of previous years comprises 16 years.

11. The non-transitory computer-readable storage medium as recited in claim 8, wherein the agricultural metrics for the each of the plurality of parcels further comprise a productivity metric and a stability metric.

12. The non-transitory computer-readable storage medium as recited in claim 11, wherein the stability metric comprises a measure of the risk associated with producing crops on the each of the plurality of parcels over a range of years.

13. The non-transitory computer-readable storage medium as recited in claim 12, wherein the wherein the productivity metric comprises a function of a weighted average of yearly primary crop yield simulation outputs, and wherein weights for the weighted average comprise fractions of tillable acreage for each of a plurality of soil type zones within the given parcel.

14. The non-transitory computer-readable storage medium as recited in claim 13, wherein the valuation for the each of the plurality of parcels comprises a function of the productivity metric, corresponding productivity metrics for all of the plurality of parcels, and corresponding sales values for the all of the plurality of parcels.

15. A system for agricultural land parcel valuation, the system comprising:

an agricultural valuation server, configured to access data corresponding to each of a plurality of parcels within a prescribed region, said data comprising corresponding management practices, corresponding historical weather conditions, corresponding locations and topography, corresponding remote sense images, corresponding soil types, and corresponding crop types, said agricultural valuation server comprising:

a management practices processor, configured to assess and rank said corresponding management practices for said each of said plurality of parcels, and configured to generate simulation inputs for said each of said plurality of parcels, wherein said simulation inputs comprise highest ranked corresponding management practices, said corresponding historical weather conditions, said corresponding locations and topography, said corresponding soil types, and said corresponding crop types;

a crop simulation processor, coupled to said management practices processor, configured employ said simulation inputs to simulate crop growth for said each of said plurality of parcels over a prescribed number of previous years;

an agricultural metrics processor, configured to employ selected outputs from said crop simulation processor to calculate agricultural metrics corresponding to said each of said plurality of parcels, said agricultural metrics comprising a sustainability metric metric and a stability metric, and wherein said sustainability metric comprises a function of an average of yearly sustainability component values, and wherein said yearly sustainability component values comprise yearly nitrogen leaching scores and yearly greenhouse gas emissions scores, and wherein said yearly nitrogen leaching scores and said yearly greenhouse gas emissions scores are calculated based upon outputs of said simulating crop growth for a corresponding year, wherein a processor disposed within said server combines best yearly vegetative index images according to a stability (HMLU) algorithm into a single HMLU image and then calculates the stability metric comprising a fraction of the single HMLU image that comprises high-stability and medium-stability pixels;

a valuation processor, configured to employ selected outputs from said simulating to calculate a valuation corresponding to said each of said plurality of parcels, wherein said valuation is expressed relative to all of said plurality of parcels within said prescribed region;

corresponding database records, comprising said agricultural metrics and said valuation corresponding to said each of said plurality of parcels; and a communications circuit, configured to,
receive search inputs from a client device; and
responsive to reception of the search inputs, transmit one or more of said corresponding database records that satisfy said search inputs to said client deice.

16. The system as recited in claim 15, wherein said prescribed region comprises a county.

17. The system as recited in claim 15, wherein said agricultural metrics for a given parcel further comprise a productivity metric and a stability metric.

18. The system as recited in claim 17, wherein said stability metric comprises a measure of the risk associated with producing crops on said each of said plurality of parcels over a range of years.

19. The method as recited in claim 18, wherein said productivity metric comprises a function of a weighted average of yearly primary crop yield simulation outputs, and wherein weights for said weighted average comprise fractions of tillable acreage for each of a plurality of soil type zones within said given parcel.

20. The method as recited in claim 19, wherein said valuation for said each of said plurality of parcels comprises a function of said productivity metric, corresponding productivity metrics for all of said plurality of parcels, and corresponding sales values for said all of said plurality of parcels.

* * * * *